United States Patent [19]

Borgen et al.

[11] Patent Number: 5,448,237
[45] Date of Patent: Sep. 5, 1995

[54] DIGITAL CIRCUIT FOR THE INTRODUCTION OF DITHER INTO AN ANALOG SIGNAL

[75] Inventors: Gary S. Borgen, Camarillo; Jeffrey J. Pacl, Oxnard, both of Calif.

[73] Assignee: The United States of America as represented by the Secretary of the Navy, Washington, D.C.

[21] Appl. No.: 209,508

[22] Filed: Mar. 8, 1994

Related U.S. Application Data

[63] Continuation-in-part of Ser. No. 4,004, Jan. 15, 1993, Pat. No. 5,311,180.

[51] Int. Cl.[6] .............................................. H03M 1/20
[52] U.S. Cl. ..................................... 341/131; 341/101
[58] Field of Search ................. 341/101, 131, 118, 155

[56] References Cited

U.S. PATENT DOCUMENTS

| | | | |
|---|---|---|---|
| 4,857,927 | 8/1989 | Takabayashi | 341/131 |
| 4,914,439 | 4/1990 | Nakahashi et al. | 341/131 |
| 5,250,948 | 10/1993 | Berstein et al. | 341/131 |

*Primary Examiner*—Marc S. Hoff
*Attorney, Agent, or Firm*—David Kalmbaugh; Melvin Sliwka

[57] ABSTRACT

An electronics circuit for digitizing an analog audio or like data signal into a six bit digital equivalent signal and then introducing a dither component into the digital equivalent signal. The electronics circuit includes an Erasable Programmed Read Only Memory (EPROM) which generates a six bit dither component to be added to the digital equivalent signal. A binary adder adds a dither bit to each of the six bits of the digital equivalent signal and then provides a three bit equivalent digital signal. The three bit equivalent digital signal is then written in parallel into a first storage register, while one bit of the three bit digital equivalent signal is written into a second storage register. When a fuze active signal, which is input to the present invention, is a logic zero the first register is enabled for a read operation allowing the three bit equivalent digital data to be read from the first register to a parallel to serial converter which converts the data to a serial three bit digital format. When the fuze activate signal is a logic one the second register is enabled for a read operation allowing the one bit equivalent digital data to be read from the second register to the parallel to serial converter which converts the data to a serial one bit digital format.

16 Claims, 17 Drawing Sheets

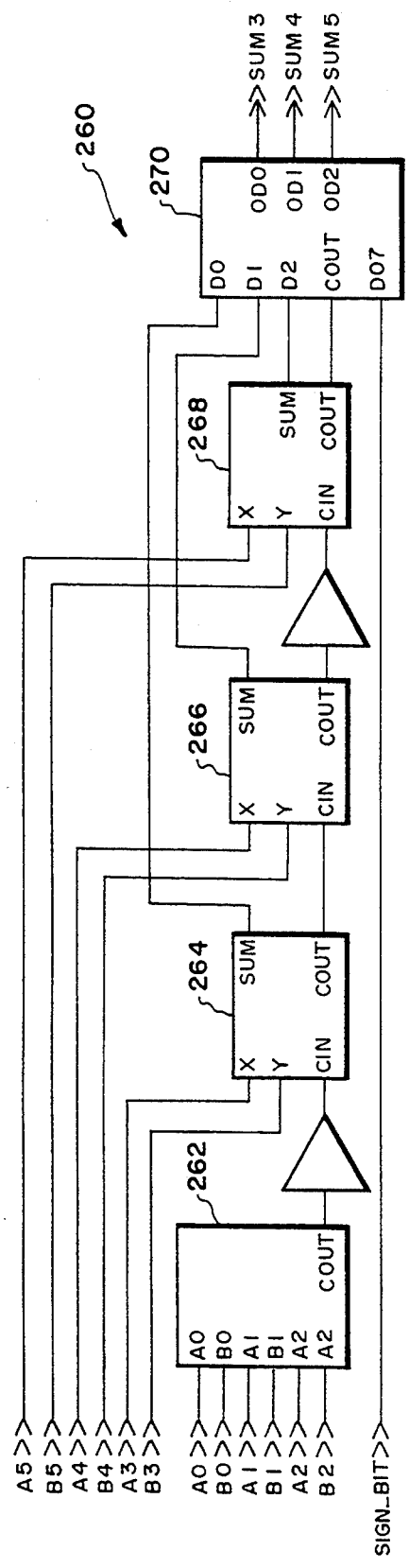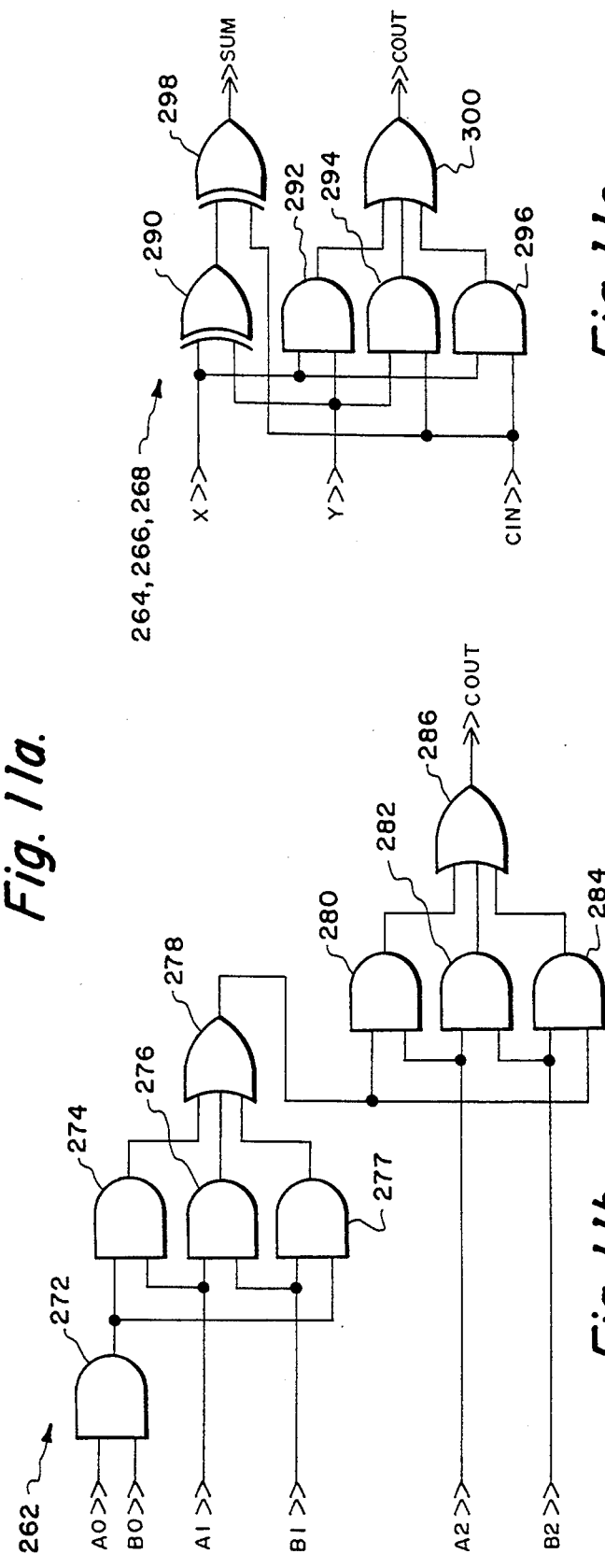
Fig. 11a.
Fig. 11b.
Fig. 11c.

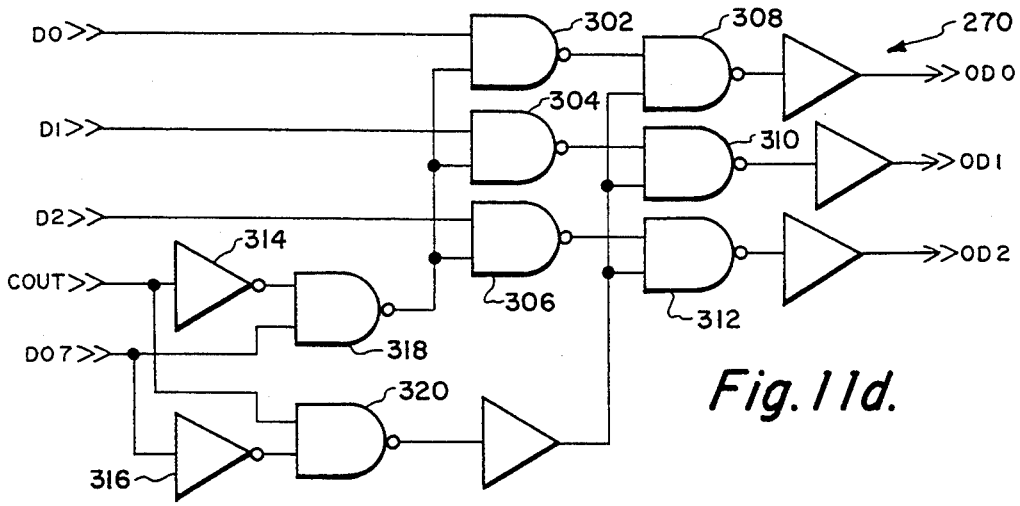
Fig. 11d.
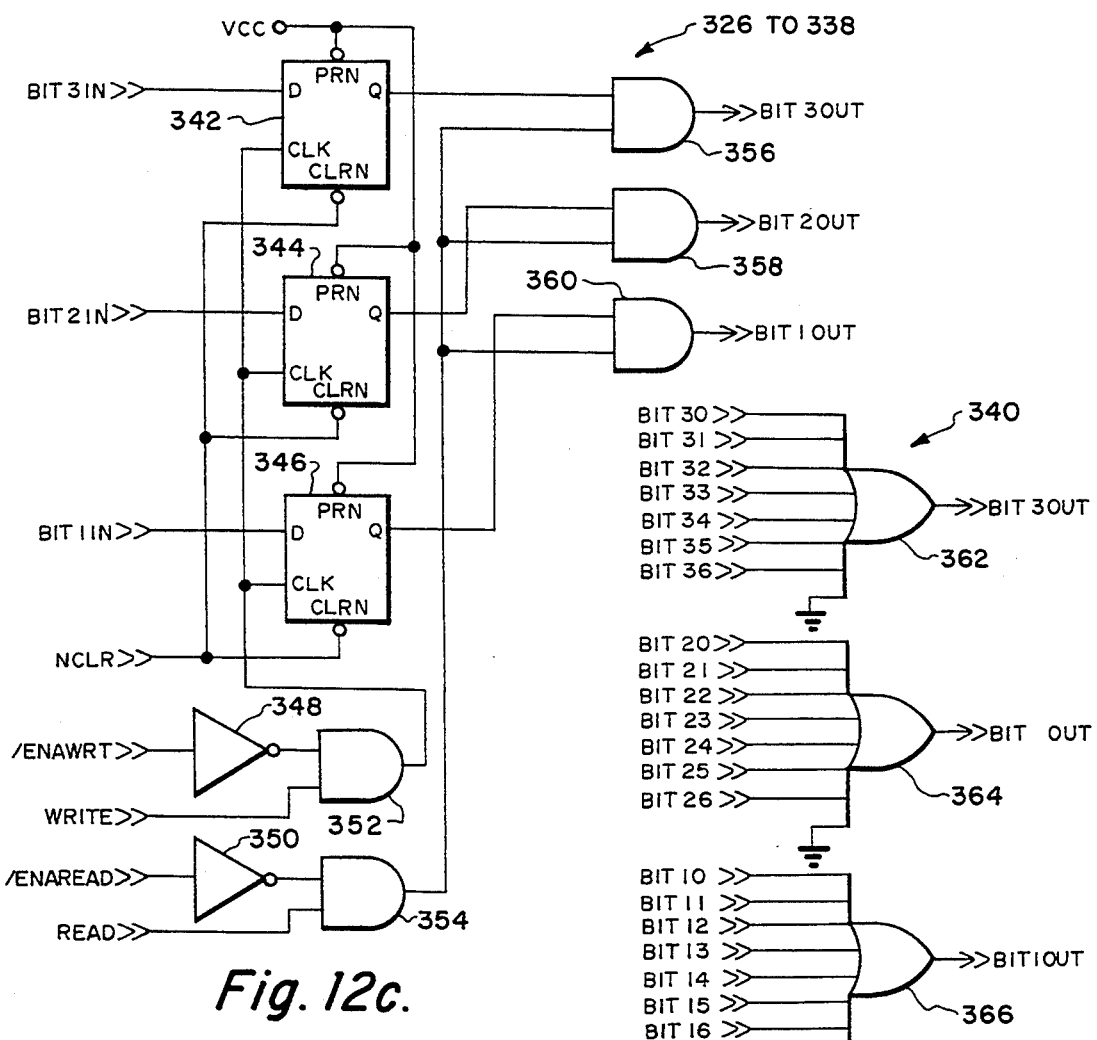
Fig. 12c.
Fig. 12d.

DIGITAL CIRCUIT FOR THE INTRODUCTION OF DITHER INTO AN ANALOG SIGNAL

This application is a continuation-in-part of U.S. patent application Ser. No. 08/004,004, filed Jan. 15, 1993, now U.S. Pat. No. 5,311,180.

BACKGROUND OF THE INVENTION

1. Field of the Invention

The present invention relates generally to the conversion of electric signals from analog to digital form. More specifically, the present invention relates to a digital circuit for translating an analog audio or like analog signal into an equivalent digital signal with the addition of dither which is an artificially created noise signal and then subsequently removing the dither from the digital signal thereby reducing noise and distortion.

2. Description of the Prior Art

The pulse code modulation (PCM) or digital processing of analog audio signals has become, or is becoming, the mainstream of high fidelity sound recording and reproduction with the advent and ever increasing commercial acceptance of compact discs. The digital processing of analog signals in the low to high frequency range is also becoming highly useful for analyzing the performance of weapons systems such as guided missiles. For example, the analog data acquired by a guided missile during flight is converted to its digital equivalent and then placed in a digital PCM frame for transmission to a ground station for analysis.

There are, however, some problems left unsolved in the art of digital processing of analog signals. For example, there is a significant difference between the samples of an analog signal and the quantized values of the samples which is generally referred to as "quantization noise". This difference becomes particularly pronounced when the input analog signal is low and there are only a small number of quantization steps, thereby, for example, distorting the reproduced sound as higher harmonics in high fidelity sound systems.

A prior art solution to this quantization noise problem has been the use of dither which is intended to turn the quantization noise into broad band white noise which has little or no effect on reproduced sound or the like and which is generally referred to as "white noise". One system of the prior art adds an analog dither signal, converted from the output from a digital dither generator by a digital to analog converter, to the incoming analog audio or analog data signal. The combined analog data and dither is digitized by an analog to digital converter and then fed to a subtractor circuit. The subtractor is also supplied the digital dither directly from the dither generator. The subtractor circuit then subtracts the dither component from the digital data and dither signal.

A second system of the prior art uses an analog dither generator in combination with a second analog to digital converter for digitizing the analog dither prior to its delivery to the subtractor. In this prior art system, analog dither is added directly to the analog data signal. The resulting dither added data signal is then digitized by the first analog to digital converter and the analog dither is digitized by the second analog to digital converter preparatory to application to the two inputs of the subtractor circuit.

While partially satisfactory for their intended purpose of removing noise and distortion from a digitized analog signal, these prior art systems ordinarily leave something to be desired in that dither components remain in the digitized data signal which manifest themselves as noise or distortion upon sound reproduction or reproduction as an analog signal for visualization and subsequent analysis. In addition, prior art systems for removing noise and distortion from a digitized analog signal often use digital signal processors as dither signal generators. Thus, such prior art systems are often complex in design as well as being expensive to manufacture.

Accordingly, it is an object of the present invention to provide an electronics circuit for accurately converting an analog audio or like data signal into its digital equivalent.

It is a further object of the present invention to provide a reliable yet relatively simplistic and inexpensive electronics circuitry for converting an analog audio or like data signal into its digital equivalent.

It is yet a further object of the present invention to provide electronics circuitry which is capable of operation with high resolution and conversion accuracy.

The above and other novel features and advantages of the present invention and the manner of realizing them will become more apparent and the invention will be best understood from a study of the following description and appended claims, with reference to the attached drawings.

SUMMARY OF THE INVENTION

According to the present invention, briefly stated, there is provided an electronics circuit for accurately digitizing an analog audio or like data signal into a six bit digital equivalent signal and then introducing a dither component into the digital equivalent signal. The electronics circuit of the present invention is characterized by an Erasable Programmed Read Only Memory (EPROM) which generates a six bit dither component to be added to the digital equivalent signal and a synchronous binary value counter which provides addressing to the EPROM. A binary adder adds a dither bit to each of the six bits of the digital equivalent signal and then provides a three bit equivalent digital signal. The binary adder is further characterized by a clipping circuit which clips the three bit equivalent digital signal to a maximum binary having each of the three bits at the logic one state and a minimum binary value having each of the three bits at the logic zero state.

The three bit equivalent digital signal is then written in parallel into a first storage register, while one bit of the three bit digital equivalent signal is written into a second storage register. When a fuze active signal, which is input to the present invention, is a logic zero the first register is enabled for a read operation allowing the three bit equivalent digital data to be read from the first register to a parallel to serial converter which converts the data to a serial three bit digital format. When the fuze activate signal is a logic one the second register is enabled for a read operation allowing the one bit equivalent digital data to be read from the second register to the parallel to serial converter which converts the data to a serial one bit digital format.

BRIEF DESCRIPTION OF THE DRAWINGS

FIGS. 11a, 11b, 11c and 11d are detailed logic diagrams of the binary adder of the circuit of FIG. 2;

FIGS. 12a, 12b, 12c and 12d are detailed logic diagrams of the 7×3 register of the circuit of FIG. 2;

DETAILED DESCRIPTION OF THE PREFERRED EMBODIMENT

Figure 1:
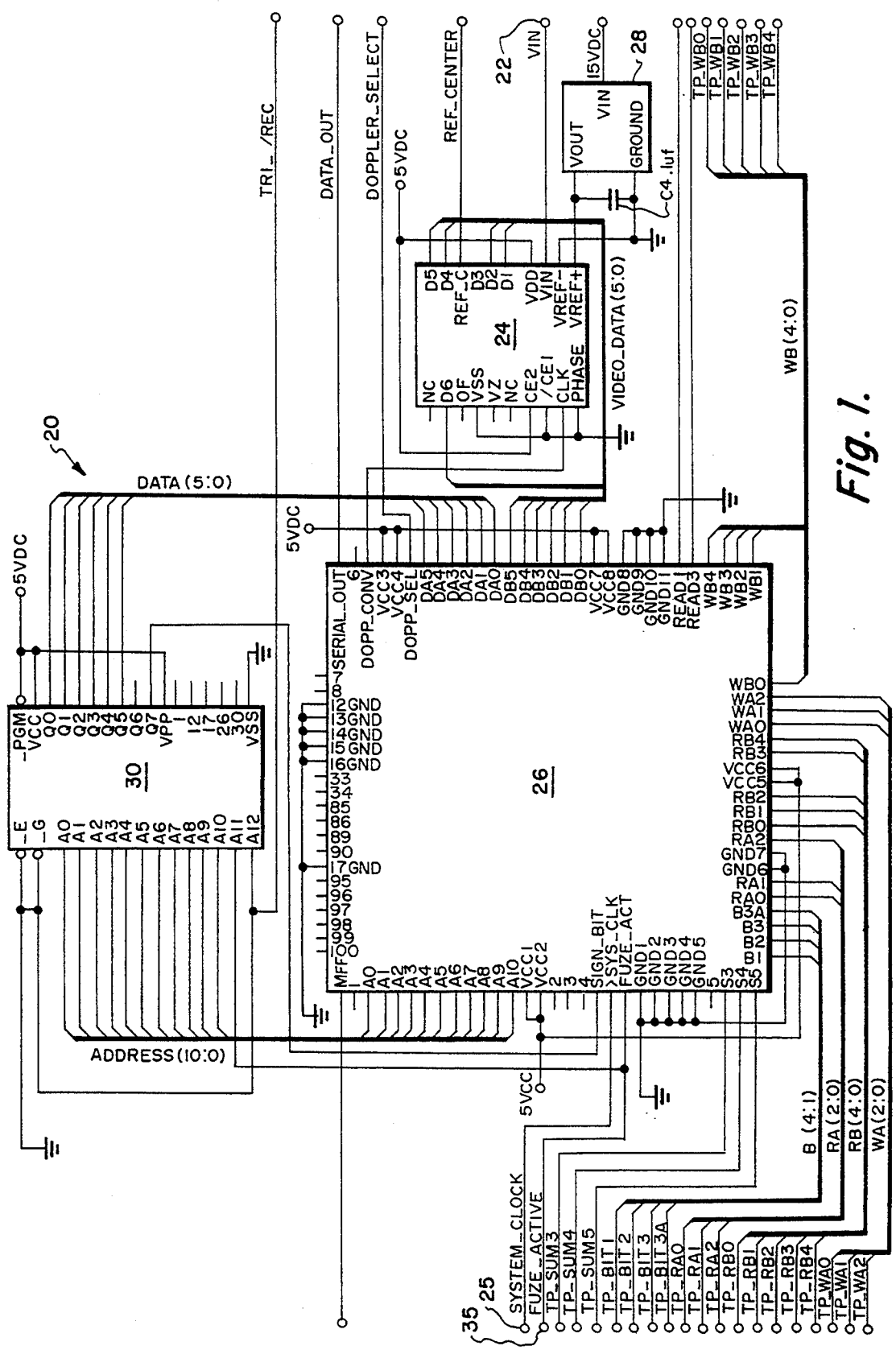
FIG. 1 is a system diagram for the digital circuit which provides for the introduction of dither to an audio or analog data signal.

The present invention will now be described in terms of the preferred embodiment illustrated in the circuit diagrams of FIGS. 1 and 2, in which the electronic circuit, designated by the reference numeral 20, is shown as adapted for use in the pulse code modulation of an analog data signal, analog audio signal or the like.

Referring first to FIG. 1, the reference numeral 22 denotes an input terminal for inputting the analog audio or analog data signal. The analog data/video doppler signal provided to the electronics circuit 20 is the tracking information from a missile in flight which is to be digitized and then forwarded via the missile's telemetry system to a ground station for analysis. However, it should be understood that the term "data signal" may mean any analog signal that can be processed by means of the present invention and which may have a frequency in the low to high frequency range as well as the audio frequency range.

The analog signal is first supplied from input terminal 22 to the VIN input of an analog to digital converter 24 which converts the analog signal to an equivalent six bit digital signal or word. This six bit signal is next provided to the DB0–DB5 inputs of an electronics circuit designated generally by the reference numeral 26. Circuit 26, in turn, is used to add a dither component to the equivalent six bit digital signal and then provide at its SERIAL_OUT output a one bit or three bit digital equivalent of the signal.

It should be noted that circuit 26 is an Erasable Programmable Logic Device, Model EPM5130Q manufactured by Altera corporation of San Jose, Calif. The circuitry and state machines illustrated in the FIGS. 1–14 are implemented in the Altera Erasable Programmable Logic Device. The computer software for the state machines of FIGS. 3a, 3b and 3c is set forth in Appendixes B, C and D and the computer software program used to generate these state machines is entitled "MAX+PLUS AHDL" (Altera High-Level Description Language) which is available from Altera Corporation.

Analog to digital converter 24 has connected thereto a DC to DC converter 28 which provides at the VREF+ and VREF− inputs of converter 24 of approximately +5 VDC and 0 VDC, respectively. There is also input to the REF_C input of converter 24 a REF_CENTER signal about which the incoming analog signal is centered. This REF_CENTER signal is about 0 VDC. The clock signal for analog to digital converter 24 is supplied by circuit 26 via its DOPP_CONV output and has a frequency of one fourth of the system clock signal, that is a frequency of six hundred kilohertz.

At this time it should be noted that the analog to digital converter 26 used in the preferred embodiment of the present invention is a Harris Corporation CMOS Video-Speed 6-Bit Flash Analog-to-Digital Converter, Model CA3006.

It should also be noted that there is a limitation in bandwidth at which the digitized information may be transmitted to a ground station because of National Telecommunications and Information Administration frequency allocation limitations and there are certain limitations inherent in a ground stations data receiving and data processing capabilities. As a result of these limitations electronics circuit 20 provides at its SERIAL_OUT output a maximum of three binary bits digitized for each six bit digitized sample of the analog data signal supplied to analog to digital converter 26.

Circuit 20 further comprises an EPROM 30 (Erasable Programmed Read Only Memory) which functions as a pseudo-random generator to generate random binary numbers by utilizing the computer software program set forth in Appendix A. The Erasable Programmed Read Only Memory used in the preferred embodiment of the present invention is a Model 27C64 64K CHMOS EPROM manufactured by Intel Corporation of Santa Clara, Calif. It should be understood that any conventional and commercially available EPROM may be used as circuit 30.

Figure 10:
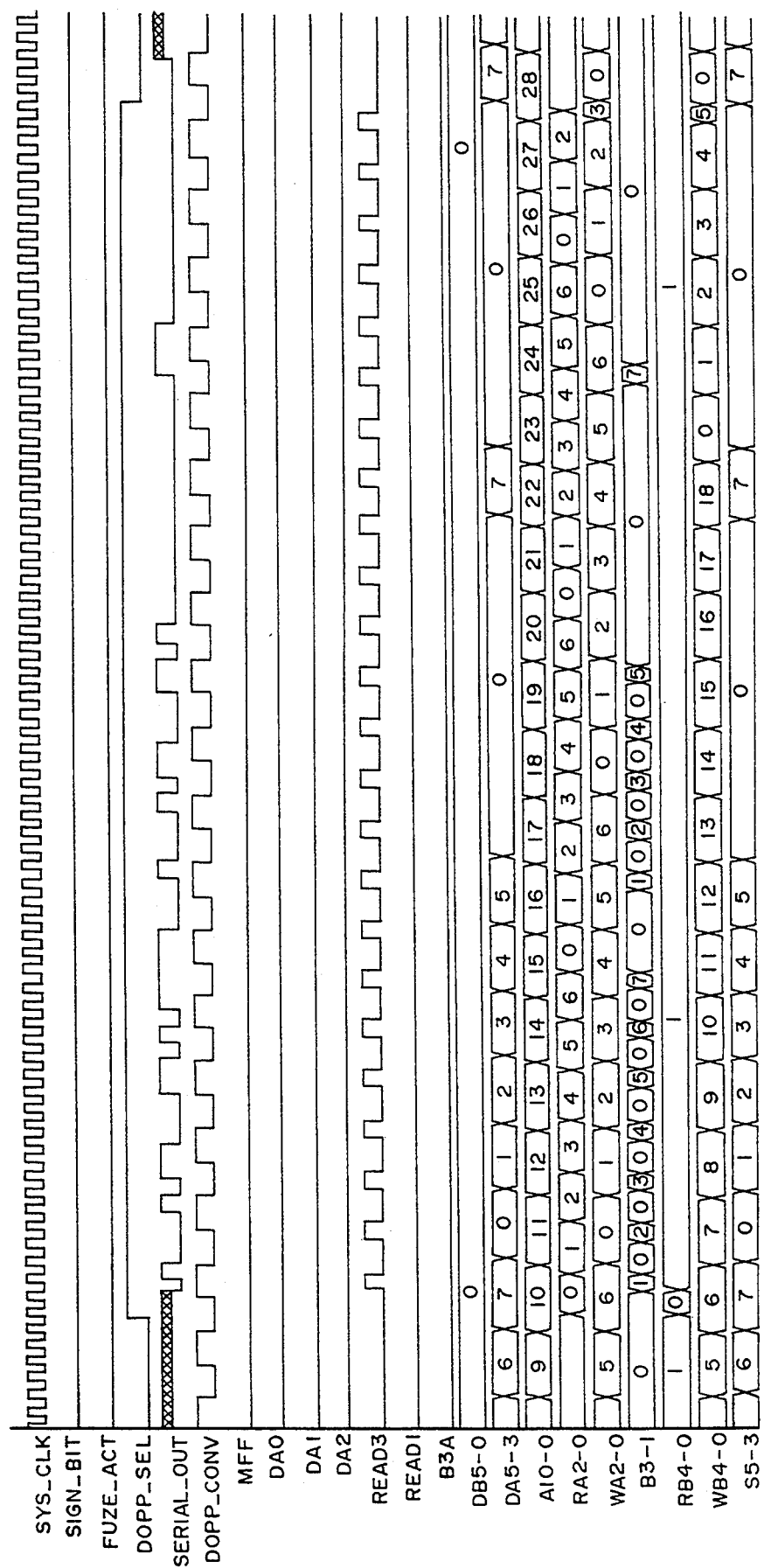
FIG. 10 illustrates some of the timing waveforms for the digital circuit constituting the present invention.
Figure 12A:
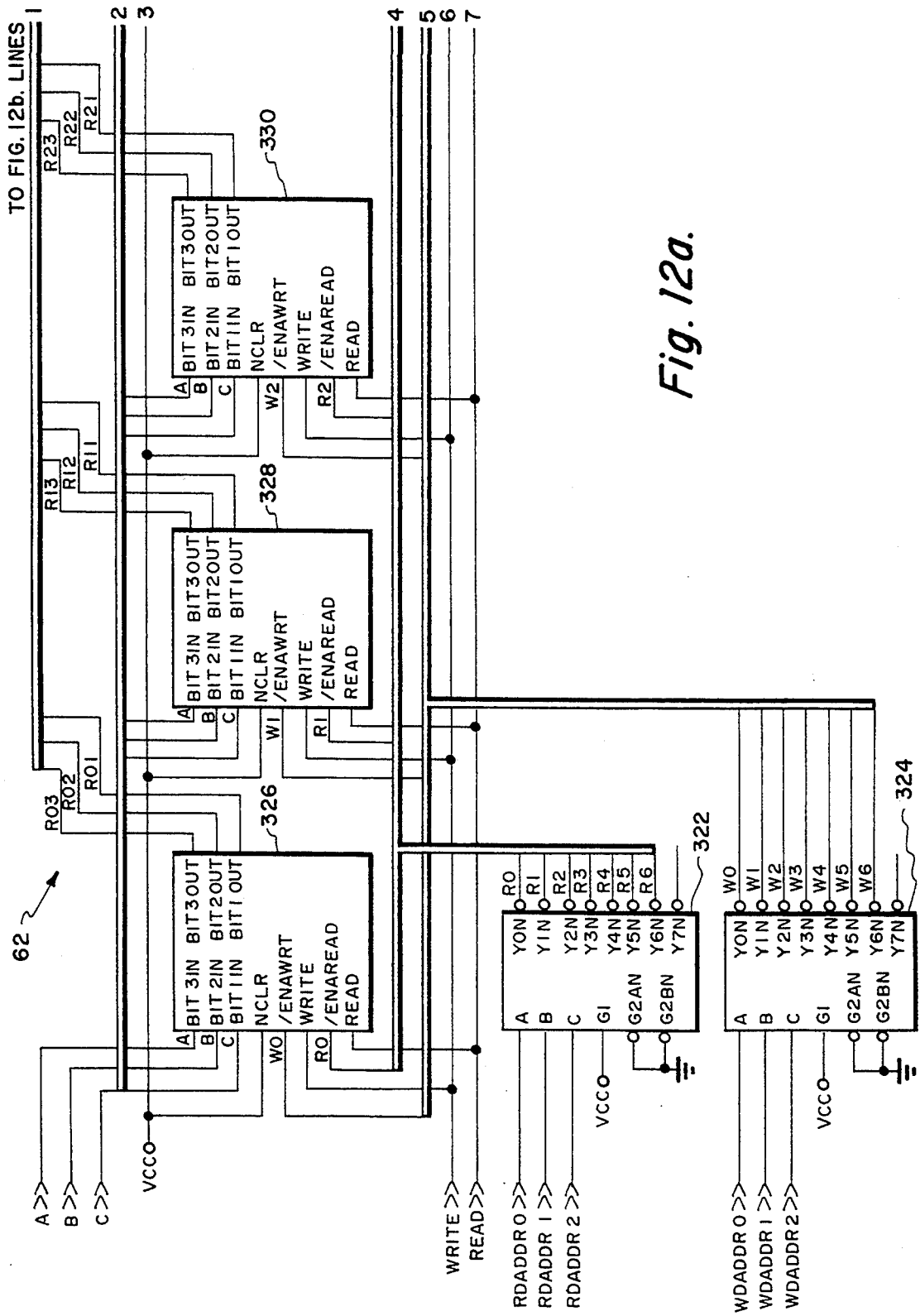
Figure 12B:
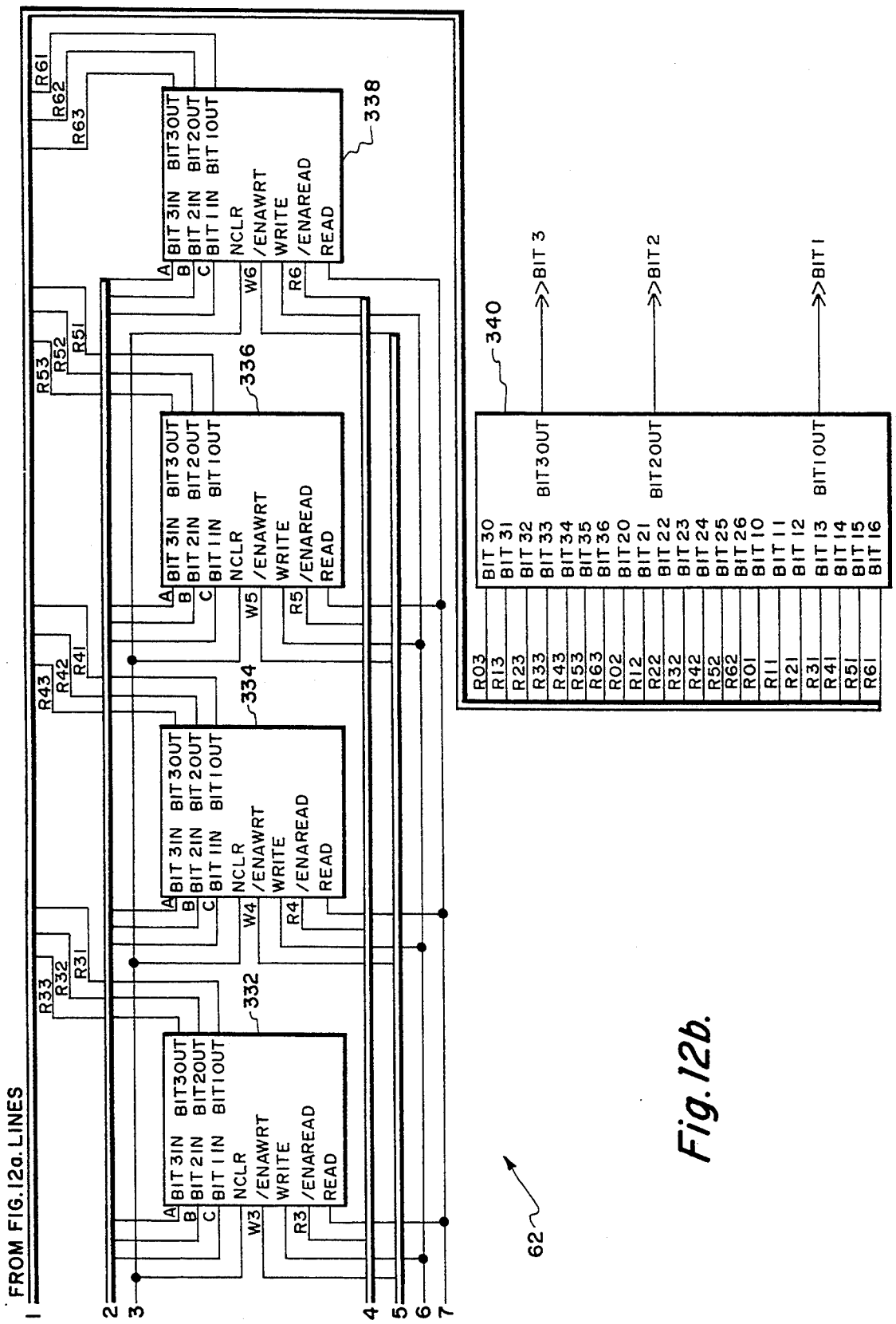
Figure 13A:
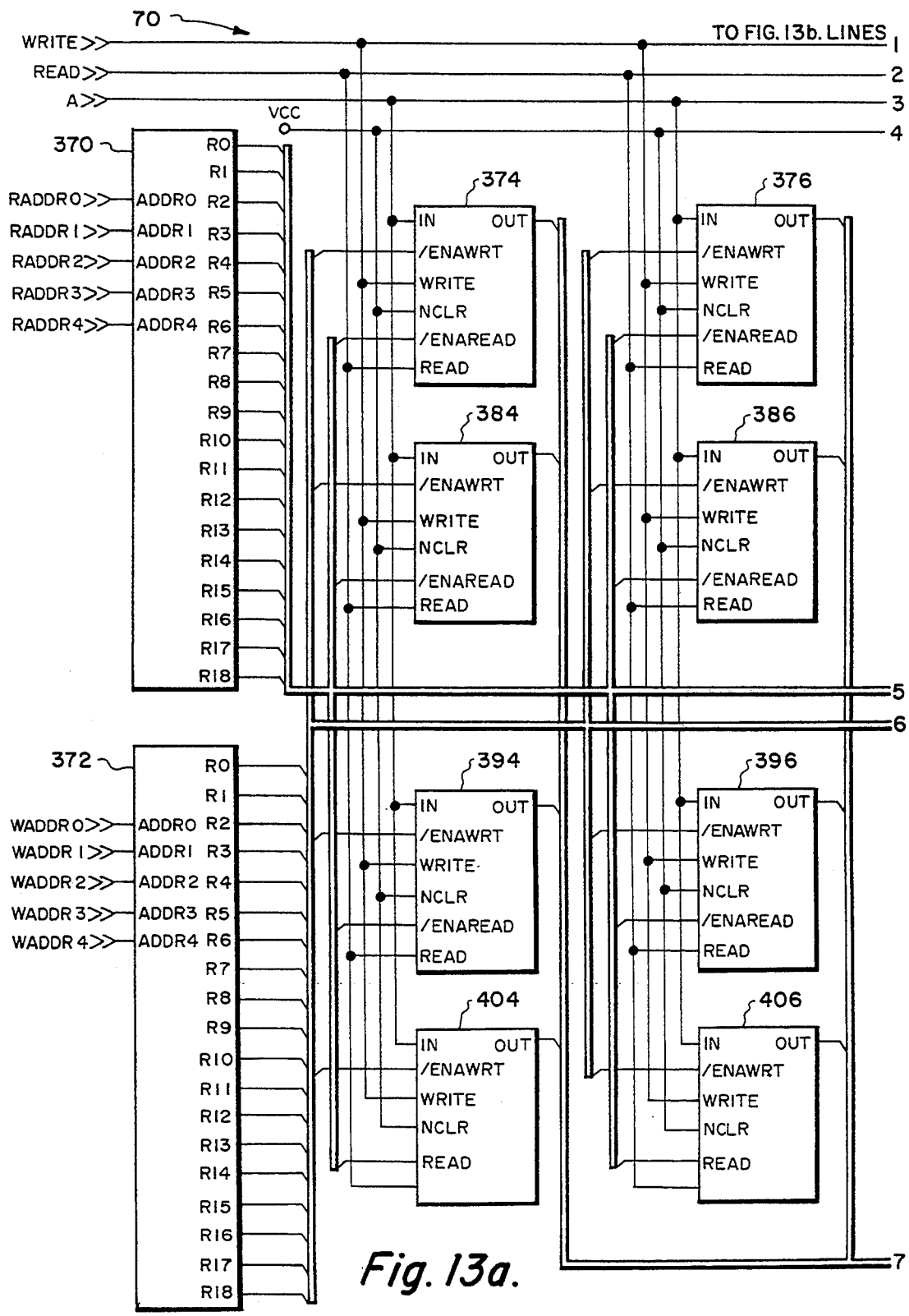
FIGS. 13a, 13b, 13c, 13d and 13e are detailed logic diagrams of the 19×1 register of the circuit of FIG. 2.
Figure 13B:
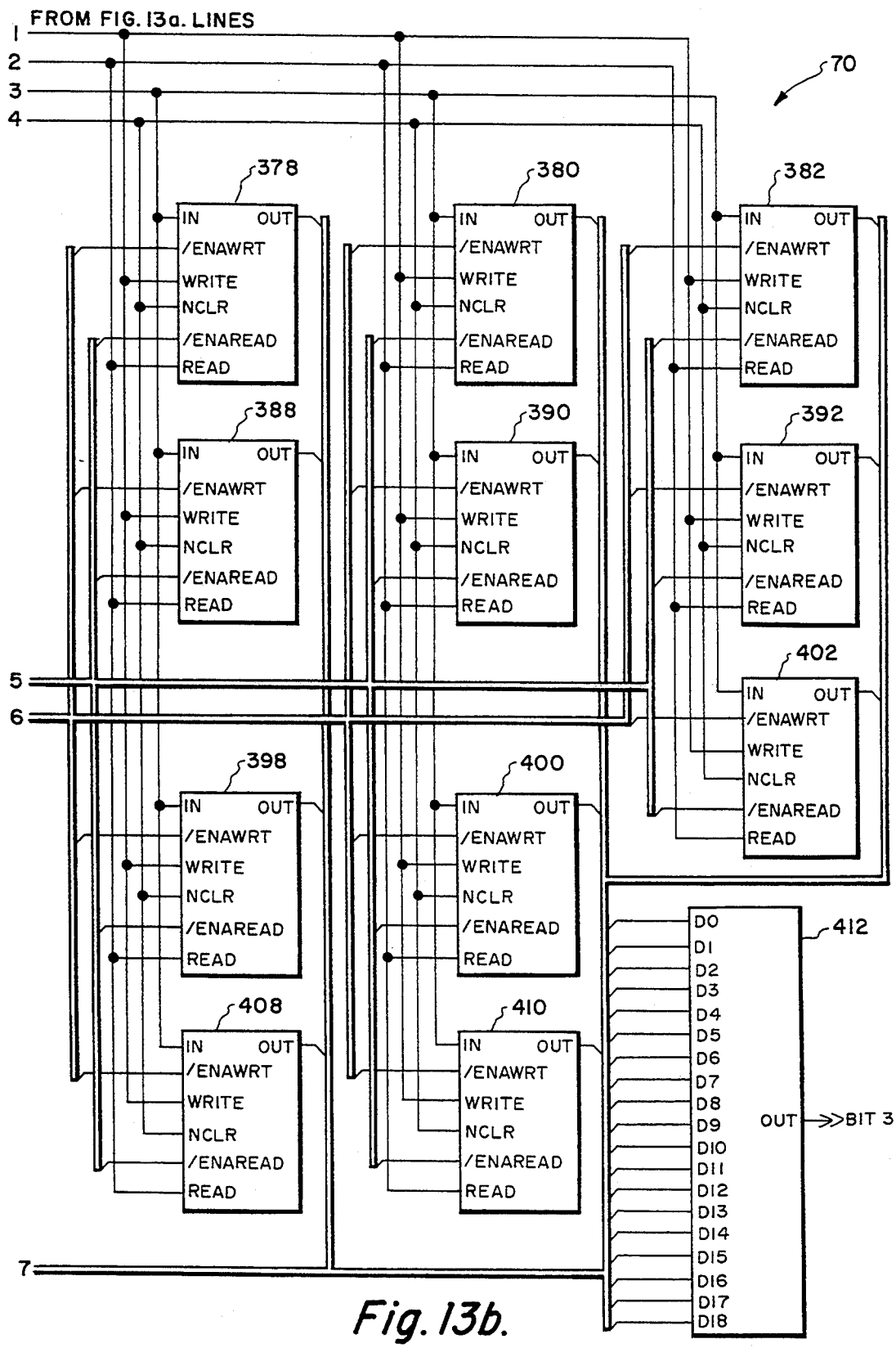
Figure 13C:
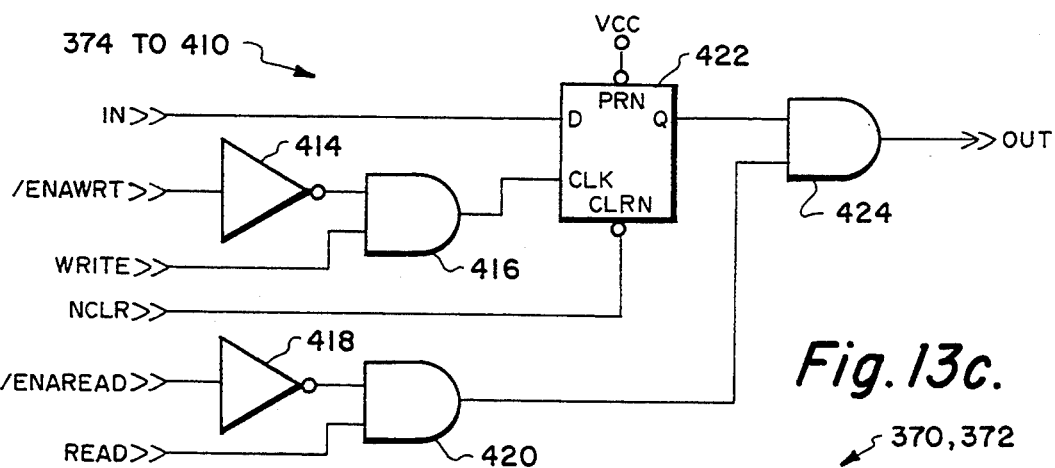
Figure 13D:
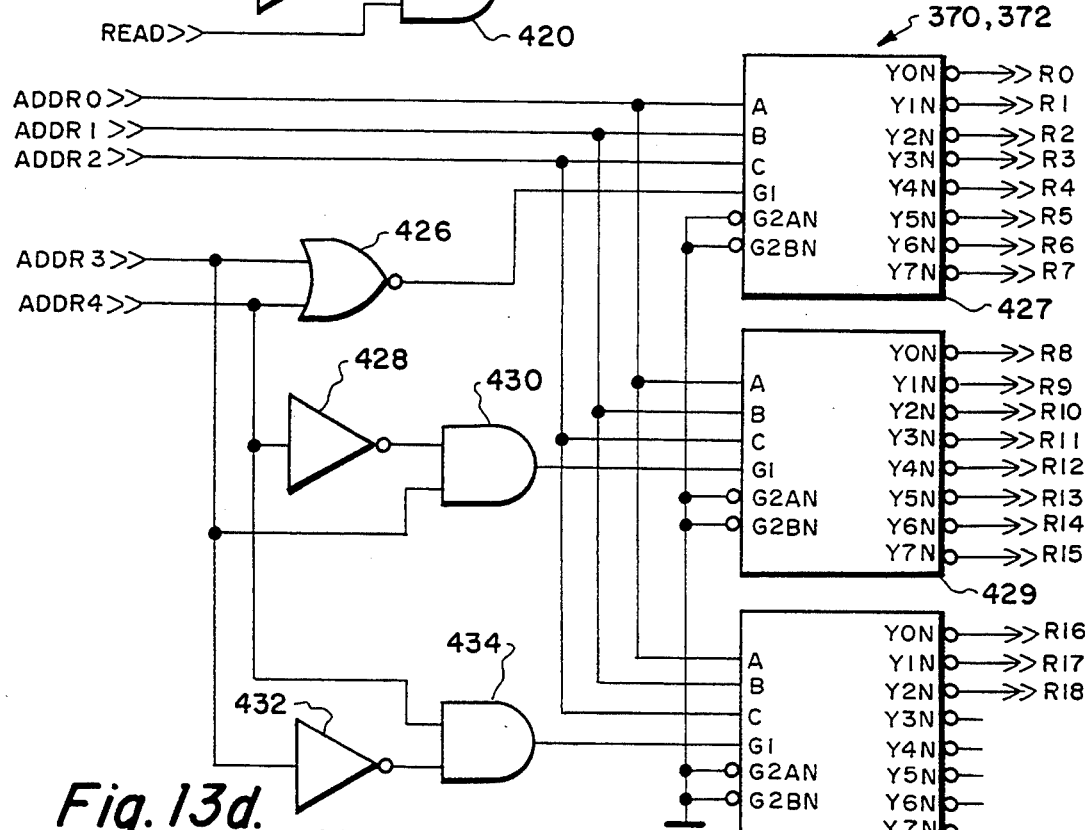
Figure 13E:
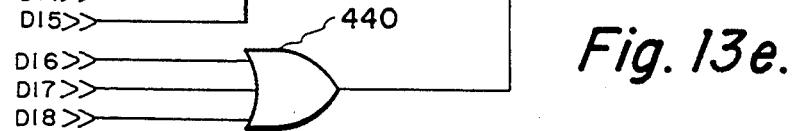

A 2.4 megahertz system clock signal, FIG. 10, from the missile telemetry receiver, bit synchronizer and decommutator, not illustrated, is supplied via a terminal (designated by reference numeral 25) to the SYS_CLK input of circuit 26. Circuit 26 in response to the 2.4 megahertz system clock signal of FIG. 10 supplies addressing to the A0–A10 inputs of a EPROM 30 which generates the random binary numbers that are the dither component of the three or one bit equivalent digitized signal provided by circuit 20.

The computer software for EPROM 30 is set forth in Appendix A. The computer software of Appendix A uses the following equation to generate a periodic pseudo-random sequence of positive integers, $I_n$:

$$I_{n+1} = (JI_n + 1) \text{ modulo } M, \quad n = 0, 1, 2, \ldots, M-1 \quad (1)$$

where J is a selected integer value and the initial value $I_n$ is arbitrary. The period of the sequence must be less than or equal to M and may be defined precisely as M if $$J = 4K + 1 \quad (2)$$

and $$M = 2^L \quad (3)$$

where K and L are integers such that M>J and L represents the word length of each random number in a binary format. The random number is generated in response to the twelve bit address supplied to the A0-A11 inputs of EPROM 30 with the eleven least significant bits of the address being supplied by circuit 26, and the twelfth bit of the address being supplied by the fuze active output terminal 35 of the missile's telemetry unit. When the twelfth bit of the address is a logic zero, circuit 20 will provide a three bit equivalent digital signal for each sample of the analog data signal occurring at input terminal 22, while a logic one at the A11 input of EPROM 30 indicates that a one bit equivalent digital signal of the analog data signal will be provided by circuit 20.

The random number generated by EPROM 30 is a six bit binary number which occurs at the Q0-Q5 of EPROM 30 and which may be either positive or negative. The logic signal provided at the Q7 output of EPROM 30 indicates whether the random number is positive or negative with a logic zero indicating that the random number is positive and a logic one indicating that the random number is negative. When the random number generated by EPROM 30 is a negative number, the two's complement of the number will occur at the Q0-Q5 outputs of EPROM 30 and a logic one will occur at the Q7 output of EPROM 30.

Figure 2A:
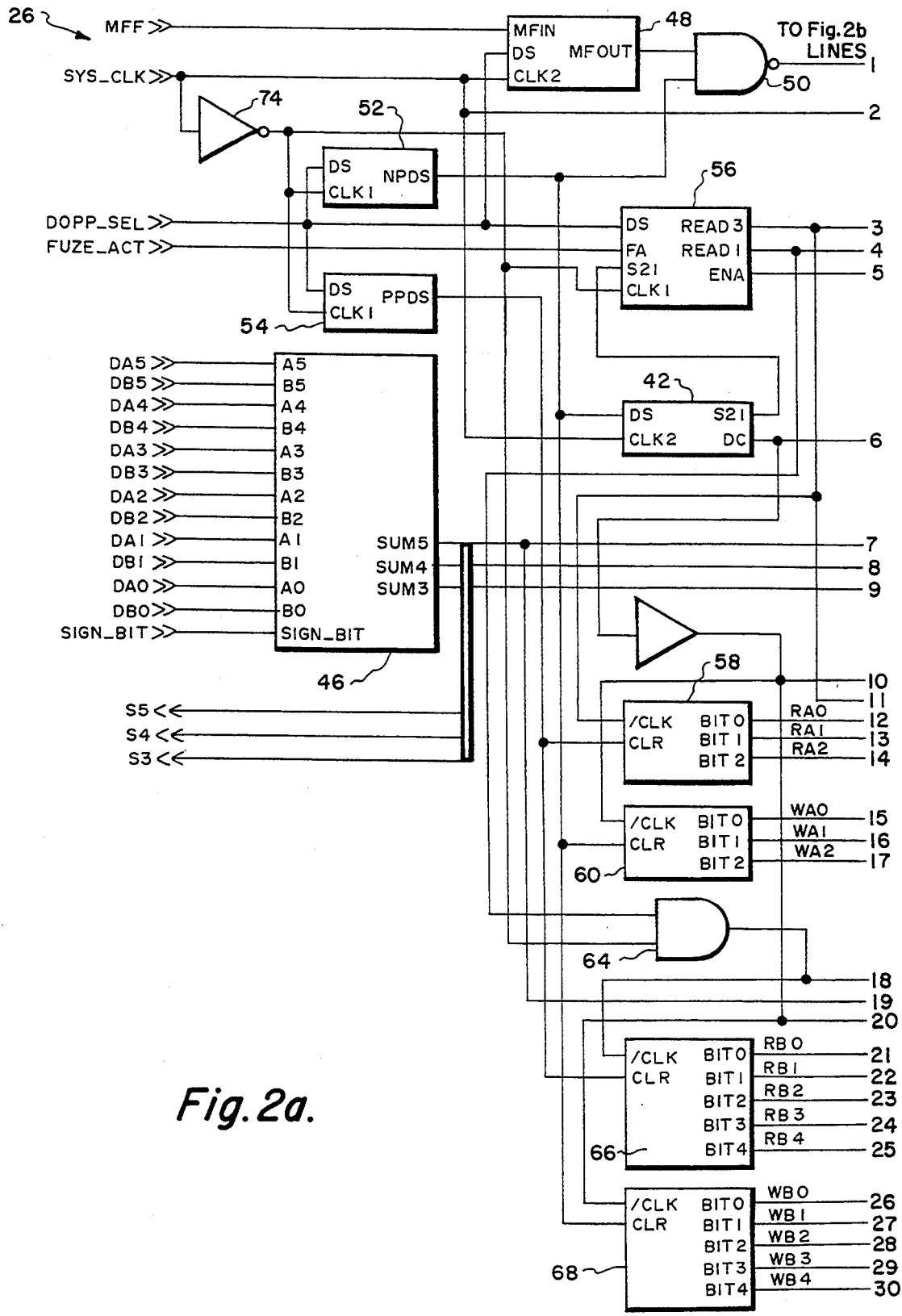
FIGS. 2a and 2b is a block diagram of the circuit wherein a dither component is added to an analog data signal converted to its digital equivalent.
Figure 2B:
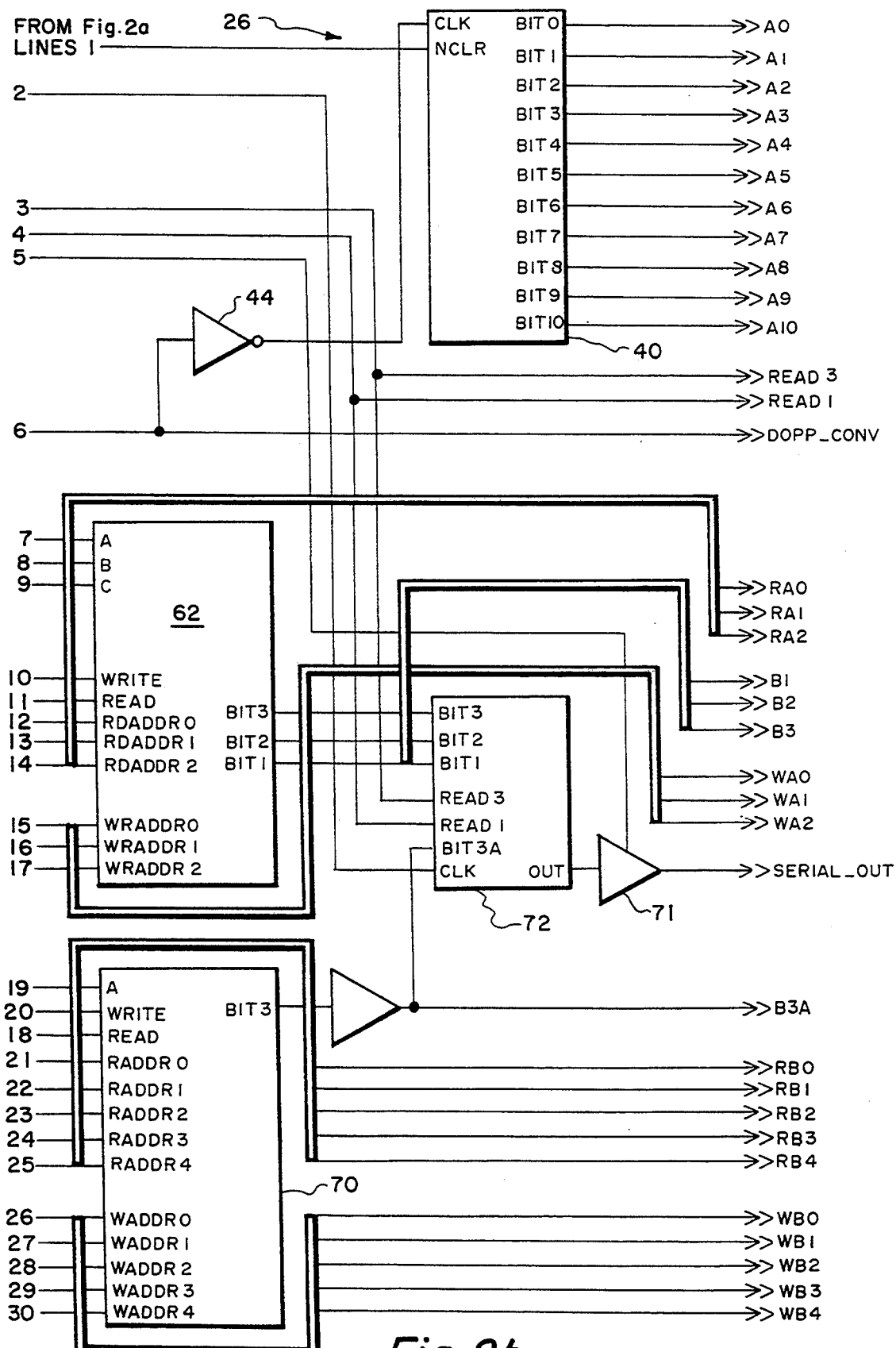
Figure 3:
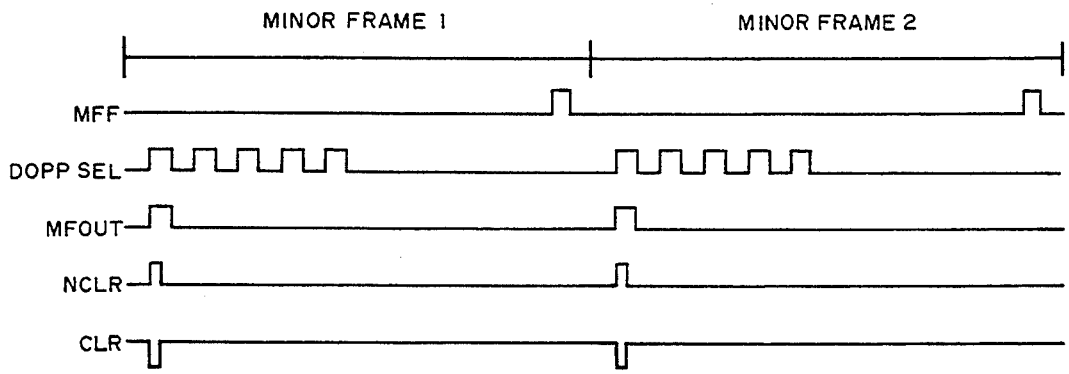
FIG. 3 illustrates some of the timing waveforms for the circuit of FIG. 2.
Figure 14:
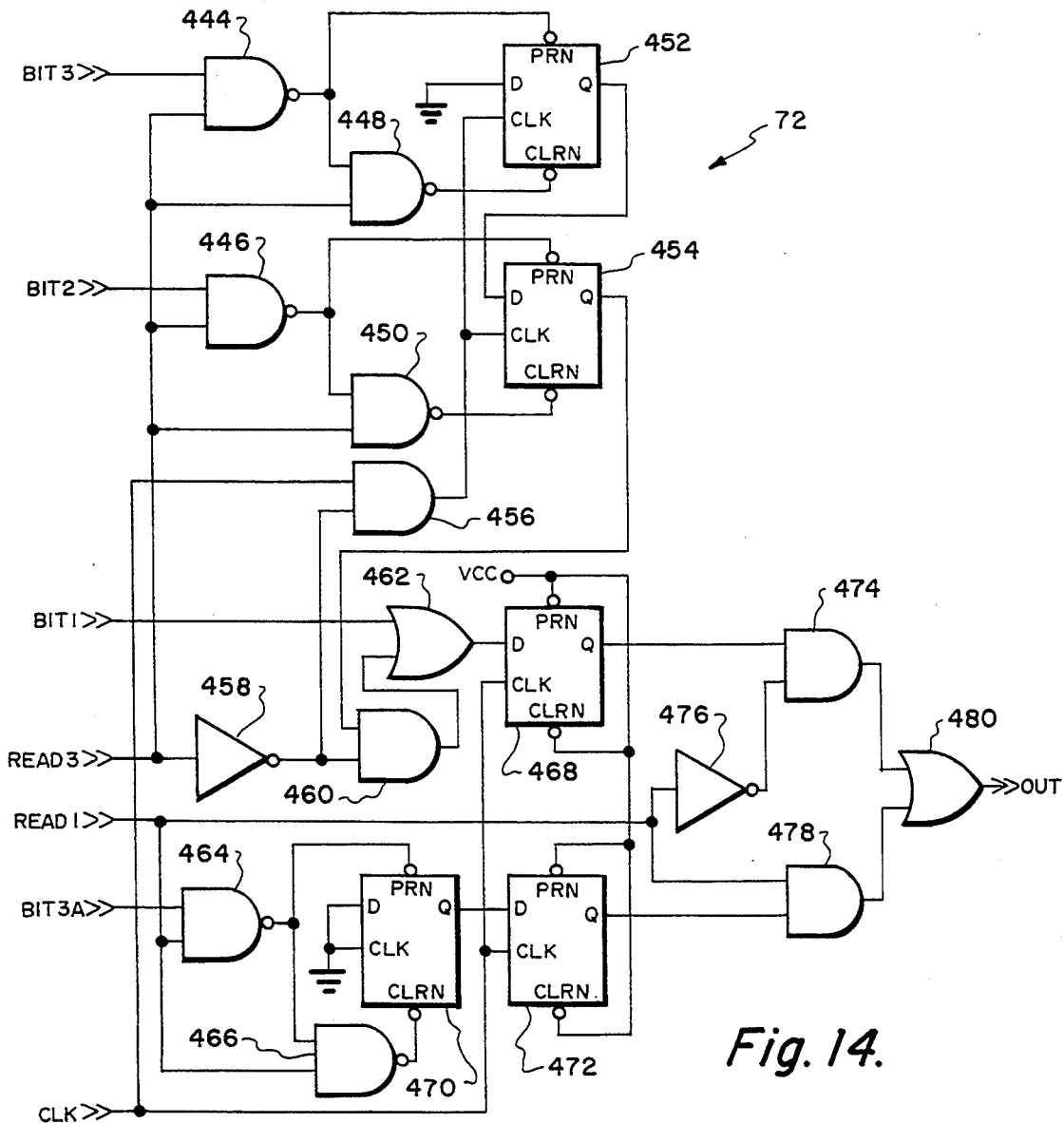
FIG. 14 is a detailed diagram of the parallel to serial converter of the circuit of FIG. 2.

Referring now to FIGS. 1, 2a and 2b, a minor frame flag signal, FIG. 3, is provided to the MFF input of circuit 26 to reset a counter 40 within circuit 26 to an address of zero. Counter 40, in turn, provides sequential addressing to EPROM 30. The clock signal supplied to counter 40 is an inversion of a six hundred kilohertz signal provided by a state machine 42. This six hundred kilohertz signal provided by state machine 42 is inverted by an inverter 44 and then supplied to the CLK input of counter 40.

There is also provided to EPROM 30 a TRI_/REC logic signal which when at the logic one state or at the logic zero state allows EPROM 30 to use the software of Appendix A to introduce optimum dither into the three bit or one bit digital equivalent signal of the analog data signal occurring at terminal 22.

When a logic zero is provided to the A12 input of EPROM 30, EPROM 30 processes a Rectangular Probability Density Function. For a three bit equivalent digital signal, the computer software of Appendix A allows EPROM 30 to generate a random binary number from TABLE I for each address supplied to the A0-A12 inputs of EPROM 30.

TABLE I

| DECIMAL | BINARY (DQ7-DQ0) | HEXADECIMAL |
|---------|------------------|-------------|
| 3       | 00000011         | 03          |
| 2       | 00000010         | 02          |
| 1       | 00000001         | 01          |
| 0       | 00000000         | 00          |
| −1      | 11111111         | FF          |
| −2      | 11111110         | FE          |
| −3      | 11111101         | FD          |
| −4      | 11111100         | FC          |

This range limitation of random numbers is, in turn, accomplished by dividing the random number generated in accordance with equation one by a predetermined number which is 248 so that the binary random number occurring at the DQ0-DQ7 outputs of EPROM 30 will fall within the range limits of TABLE 1.

Similarly, for a Rectangular Probability Density Function and a one bit equivalent digital signal, the computer software of Appendix A allows generator 30 to generate a random binary number between +15 (00001110) and −16 (11110000).

Whenever the A12 input of EPROM 30 is provided a logic one a Triangular Probability Density Function will be accessed by EPROM 30, thereby allowing optimum dither to be introduced into the three bit or one bit digital equivalent signals of the analog data signal occurring at terminal 22. For a Triangular Probability Density Function and a three bit equivalent digital signal, the computer software of Appendix A allows EPROM 30 to generate a random binary number between +8 (00001000) and −8 (11111000) for each address supplied to the A0-A12 inputs of EPROM 30. Similarly, for a Triangular Probability Density Function and a one bit digital equivalent signal, the computer software of Appendix A allows EPROM 30 to generate a random binary number between +32 (00100000) and −32 (11100000).

A thorough discussion of the addition of digital dither to a pulse code modulated audio or other analog signal may be found in a publication entitled "Dither and Noise Shaping in Audio Applications" by Robert R. Wannamaker, published in 1991 which may be obtained from the University of Waterloo, Waterloo, Ontario, Canada.

At this time it should be noted that the A12 input of EPROM 30, as is best illustrated in FIG. 1, is connected to ground thereby allowing EPROM 30 to process only a Rectangular Probability Density Function. By removing the hard wired connection between ground and the A12 input of EPROM 30, EPROM 30 can process either a Rectangular or a Triangular Probability Density Function depending upon the logic level of the TRI_/REC logic signal supplied to the A12 input of EPROM 30.

Circuit 26 further comprises a binary adder 46 which adds a six bit dither component from EPROM 30 to the six bit digital equivalent signal provided by converter 24 so as to provide at its SUM3-SUM5 outputs a three bit equivalent signal with a dither component.

Referring to FIGS. 2a, 2b, 3 and 4a, there is supplied to the MFIN input of a state machine 48, the minor frame flag signal of FIG. 3. When the minor frame flag transitions to the logic one state, state machine 48 transitions from state ST0 to ST1 remaining in state ST1 until a doppler select signal (DOPP SEL) is supplied from the missile's telemetry system to the DS input of state machine 48. The transition to the logic one state of the doppler select signal of FIG. 3 causes state machine 48 to transition to state ST2 which results in a logic zero to one transition at the MFOUT output of state machine 48. When the doppler select signal of FIG. 3 transitions from the logic one state to the logic zero state, state machine 48 will return to state ST0 which results in logic one to zero transition at the MFOUT output of state machine 48. This, in turn, is the MFOUT pulse signal of FIG. 3 which is supplied to the first input of a NAND gate 50 enabling NAND gate 50. It should be noted that state machine 48 is clocked by the 2.4 megahertz system clock signal of FIG. 10 which is supplied to the CLK2 input of state machine 48.

Enabling NAND gate 50 allows an NCLR pulse, FIG. 3, generated by a negative pulse generating circuit 52 to pass through and be inverted NAND gate 50 resulting in the CLR pulse signal of FIG. 3 being supplied to counter 40. The CLR pulse signal of FIG. 3 resets counter 40.

Referring to FIGS. 2a, 2b, 3 and 4b, the 2.4 megahertz system clock signal of FIG. 10 is provided to the CLK2 input of state machine 42 which, in response to this signal, first transitions from state ST0 to state ST1. When state machine 42 transitions from state ST0 to state ST1, state machine 42 provides a logic zero to one transition at its DC output which is inverted by inverter 44. The next clock pulse of the 2.4 megahertz system clock signal of FIG. 10 causes state machine 42 to transition from state ST1 to state ST2 with the DC output of state machine 42 remaining at the logic one state. Another clock pulse of the system clock signal causes the DC output of state machine 42 to transition from a logic one state to a logic zero state which results in a logic zero to one transition at the output of inverter 44. State machine 42 next transitions to the ST0 state resulting in a signal at the DC output having a frequency which is one fourth of the frequency of the signal supplied to the CLK input of state machine 42.

Figure 4A:
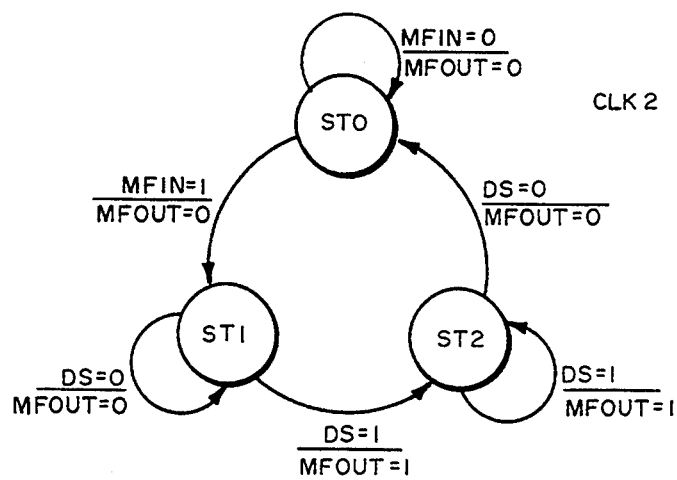
FIG. 4a–4c are state machine diagrams for the state machines of the circuit of FIG. 2.
Figure 4B:
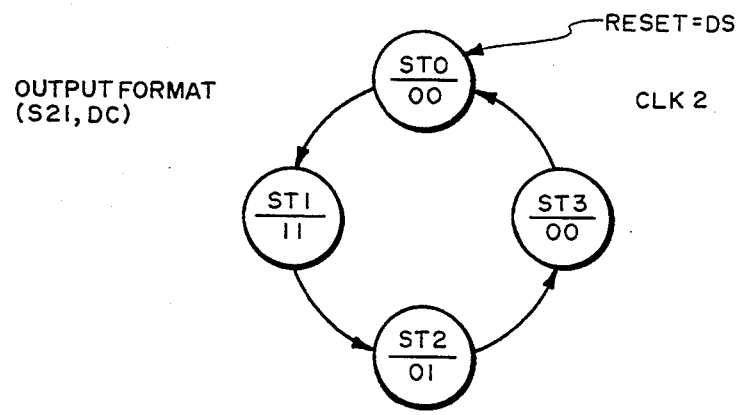
Figure 4C:
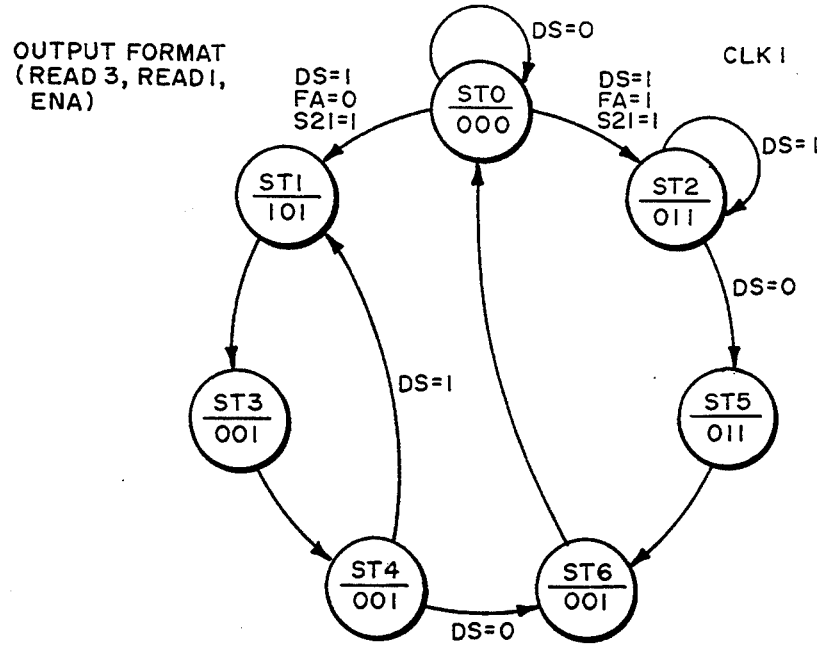
Figure 5A:
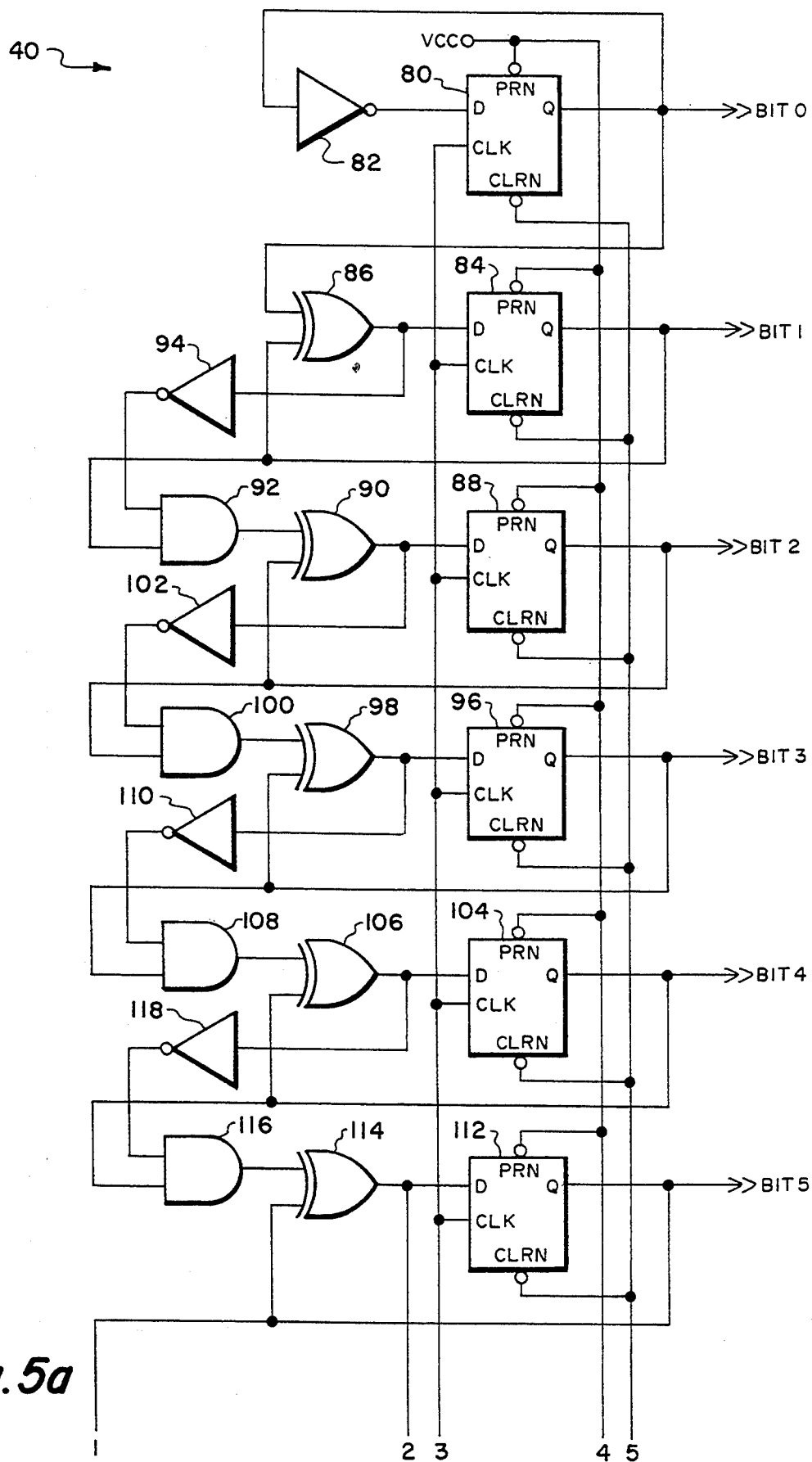
FIGS. 5a and 5b is a detailed logic diagram of the eleven bit counter of the circuit of FIG. 2.
Figure 5B:
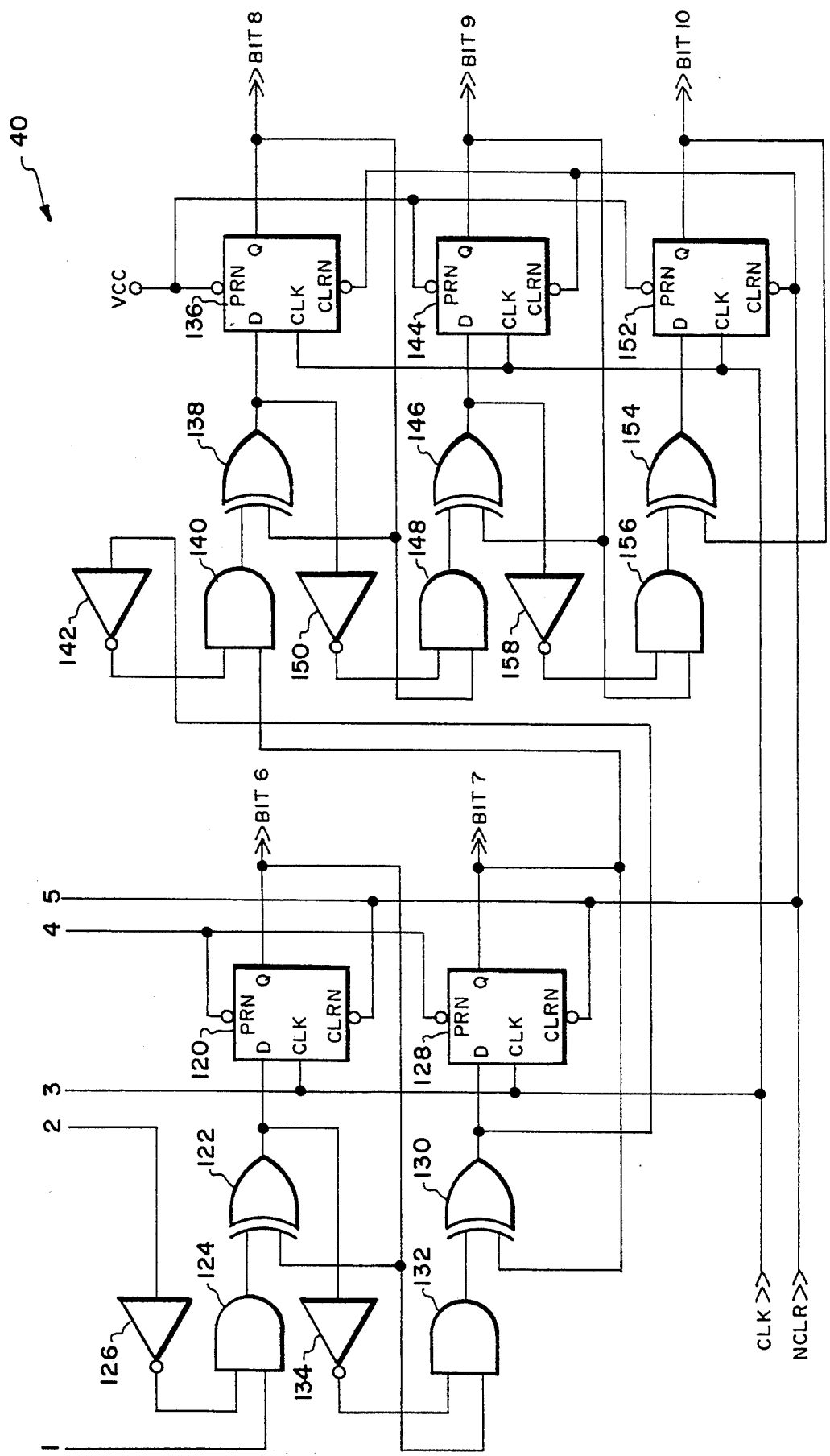

Referring to FIGS. 2a, 2b and 4c, when the DOPP_SEL signal of FIG. 10 is a logic one, the FUZE_ACT signal is a logic zero and the S21 signal from state machine 42 is a logic one, state machine 56 transitions to state ST1 allowing state machine 56 to provide the READ3 signal of FIG. 10. State machine 56 will also provide a logic one enable signal to the enable input of a tri-state buffer 71 which upon being enabled will allow three bit serial digital data to be read from circuit 26 via the SERIAL_OUT output of circuit 26.

State machine 56 will transition through states ST1, ST3 and ST4 as long as the DOPP_SEL signal of FIG. 10 is at the logic one state. This transition of state machine 56 through states ST1, ST3 and ST4 results in state machine 56 providing the pulses of the READ3 signal of FIG. 10 which are provided to the /CLK input of counter 58 and the READ input of register 62 allowing data to be read from register 62. When the DOPP_SEL signal of FIG. 10 transitions to a logic zero state, the state machine proceeds through state ST6 to state ST0.

Referring again to FIGS. 2a, 2b and 4c, when the DOPP_SEL signal of FIG. 10 is a logic one, the FUZE_ACT signal is a logic one and the S21 signal from state machine 42 is a logic one, state machine 56 transitions to state ST2 allowing state machine 56 to provide the READ1 signal at the logic one state which is then supplied to AND gate 64. State machine 56 will also provide a logic one enable signal to the enable input of a tri-state buffer 71 which upon being enabled will allow one bit serial digital data to be read from circuit 26 via the SERIAL_OUT output of circuit 26.

State machine 56 will transition to state ST2 and remain at state ST2 as long as the DOPP_SEL signal of FIG. 10 is at the logic one state. This transition of state machine 56 to state ST2 allows an inverted 2.4 megahertz system clock signal to pass through AND gate 64 to the /CLK input of counter 66 and the READ input of register 70 allowing data to be read from register 70. When the DOPP_SEL signal of FIG. 10 transitions to a logic zero state, the state machine proceeds through state ST5 and ST6 to state ST0. It should be noted that state machine 56 is clocked through its various states by the inverted 2.4 megahertz system clock signal.

Referring to FIGS. 1, 2a, 2b and 5, counter 40 provides addressing for EPROM 30. The NCLR signal from NAND gate 50, which is active low, is used to clear D Flip-Flops 80, 84, 88, 96, 104, 112, 120, 128, 136, 144 and 152. The leading edge of the 600 kilohertz clock signal DC from state machine 42 clocks D Flip-Flops 80, 84, 88, 96, 104, 112, 120, 128, 136, 144 and 152.

When cleared the Q outputs of Flip-Flops 80, 84, 88, 96, 104, 112, 120, 128, 136, 144 and 152 are set at the logic zero state. The logic zero at the Q output of Flip-Flop 80 is inverted by an inverter 82 resulting in a logic one being supplied to the D input of Flip-Flop 80. A first clock pulse of the 600 kilohertz clock signal clocks the logic one to the Q output of Flip-Flop 80 resulting in a logic one being supplied to the A0 input of EPROM 30 and logic zeros being supplied to the A1-A10 inputs of EPROM 30. This is the first sequential binary address provided to EPROM 30 by counter 40.

The logic one at the Q output of Flip-Flop 80 is inverted by inverter 82 resulting in a logic zero at the D input of Flip-Flop 80. The logic one at the Q output of Flip-Flop 80 is also supplied to the first input of an EXCLUSIVE-OR gate 86 while a logic zero is supplied to the second input of EXCLUSIVE-OR gate 86. This results in a logic one occurring at the output of EXCLUSIVE-OR gate 86 which is then supplied to the D input of Flip-Flop 84. A second clock pulse of the 600 kilohertz clock signal clocks the logic zero at the D input of Flip-Flop 80 to its Q output and the logic one at the D input of Flip-Flop 84 to its Q output resulting in a logic one being supplied to the A1 input of EPROM 30 and logic zeros being supplied to the A0 and A2-A10 inputs of EPROM 30. This is the second sequential binary address provided to EPROM 30 by counter 40.

Inverter 82 inverts the logic zero occurring at the D output of Flip-Flop 80 to a logic one resulting in logic ones at the D inputs of Flip-Flops 80 and 84. A third clock pulse of the 600 kilohertz clock signal will clock the logic ones to the Q outputs of Flip-Flops 80 and 84 which results in logic ones being supplied to the A0 and A1 inputs of EPROM 30 and logic zeros being supplied to the A2-A10 inputs of EPROM 30. This is the third sequential binary address provided to EPROM 30 by counter 40.

EXCLUSIVE-OR gate 86 is now at the logic zero state since logic ones are being supplied to its first and second inputs. This logic zero is supplied to an inverter 94 resulting in a logic one at its output. The logic one occurring at the D output of Flip-Flop 84 is supplied to the first input of an AND gate 92 while the second input of AND gate 92 receives the logic one occurring at the output of inverter 94. A fourth clock pulse of the 600 kilohertz clock signal will clock the logic zeros at the D inputs of Flip-Flops 80 and 84 to their respective Q outputs and the logic one at the D input of Flip-Flop 88 to its Q output. This results in a logic one at the A2 input of EPROM 30 and logic zeros at the A0, A1 and A3-A10 inputs of EPROM 30. This is the fourth sequential binary address provided to EPROM 30 by counter 40.

A fifth clock pulse of the 600 kilohertz clock signal will result in logic ones occurring at the D outputs of Flip-Flops 80 and 88 and logic zeros occurring at the D outputs of Flip-Flops 84, 96, 104, 112, 120, 128, 136, 144 and 152. This results in logic ones being provided to the A0 and A2 inputs of EPROM 30 and logic zeros being provided to the A1 and A3-A10 inputs of EPROM 30. This is the fifth sequential binary address provided to EPROM 30 by counter 40.

Similarly, a sixth clock pulse of the 600 kilohertz clock signal will result in logic ones being provided to the A1 and A2 inputs of EPROM 30 and logic zeros being provided to A0 and A3–A10 inputs of EPROM 30. This is the sixth sequential binary address provided to EPROM 30 by counter 40.

In a like manner, a seventh clock pulse of the 600 kilohertz clock signal will result in logic ones being provided to the A0, A1 and A2 inputs of EPROM 30 and logic zeros being provided to the A3–A10 inputs of EPROM 30. This is the seventh sequential binary address provided to EPROM 30 by counter 40.

An eighth clock pulse of the 600 kilohertz clock signal will result in a logic one occurring at the D output of Flip-Flop 96 and logic zeros at the D outputs of Flip-Flops 80, 84, 88, 104, 112, 120, 128, 136, 144 and 152. This results in a logic one being supplied to the A3 input of EPROM 30 and logic zeros being supplied to the A0–A2 and A4–A10 inputs of EPROM 30, which is the eighth sequential binary address provided to EPROM 30 by counter 40.

Counter 40 continues to provide addressing to EPROM 30 until a NCLR pulse is received by the counter 40 to clear the Flip-Flops of counter 40. It should be noted that Counter 40 is a synchronous binary counter which provides for a change of state of any of the outputs of counter 40 only on the leading edge of one of the clock pulses of the 600 kilohertz clock signal.

Figure 6:
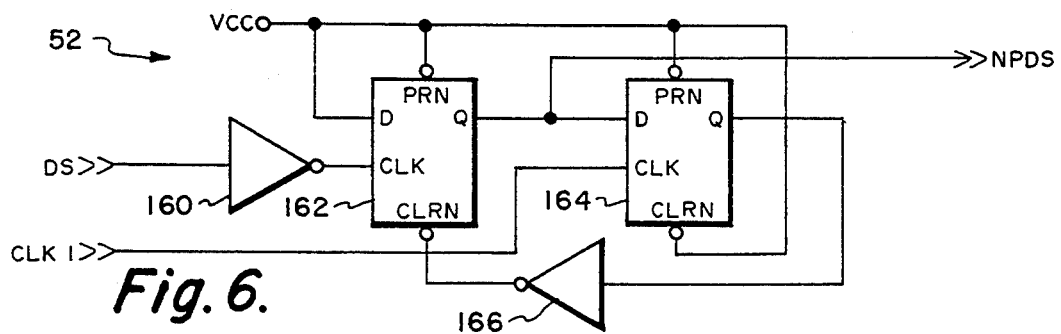
FIG. 6 is a detailed logic diagram of the negative pulse generating circuit of the circuit of FIG. 2.

Referring to FIGS. 2a, 2b and 6, negative pulse generating circuit 52 first receives a pulse of the DOPP SEL signal of FIG. 3 and then inverts this pulse so that the trailing edge of this pulse clocks the logic one at the D input of Flip-Flop 162 to its Q output. The logic one at the Q output of Flip-Flop 162 is then clocked through Flip-Flop 164 by a clock pulse of the 2.4 megahertz CLK1 signal supplied by inverter 74 to CLK input of Flip-Flop 164. The logic one occurring at the Q output of Flip-Flop 164 is next supplied to an inverter 166 which inverts the logic one to a logic zero resulting in the logic zero being provided to the CLRN input of Flip-Flop 162 resetting the Q output of Flip-Flop 162 to the logic zero state. This results in negative pulse generating circuit 52 generating the NCLR pulse, FIG. 3, which is then supplied to NAND gate 50 which responsive to this pulse provides the CLR pulse signal of FIG. 3 to counter 40 resetting counter 40.

At this time it should be noted that the 2.4 megahertz CLK1 signal supplied by inverter 74 is an inversion of the 2.4 megahertz system clock signal of FIG. 10.

Figure 7:
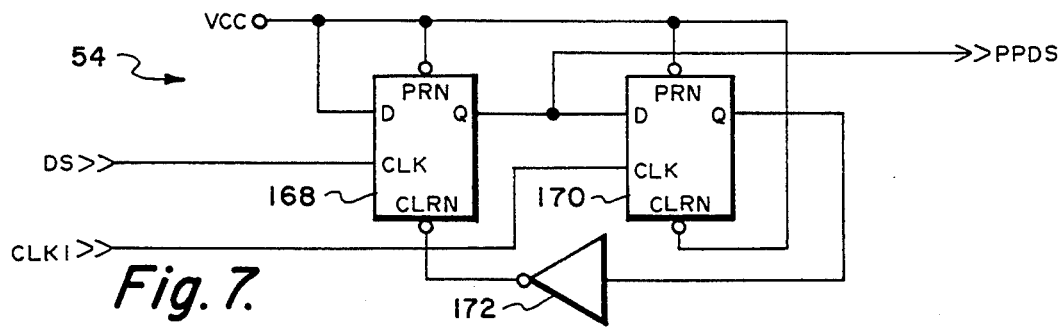
FIG. 7 is a detailed logic diagram of the positive pulse generating circuit of the circuit of FIG. 2.

Referring to FIGS. 2a, 2b and 7, positive pulse generating circuit 54 first receives a pulse of the DOPP_SEL signal of FIG. 3. The leading edge of this pulse then clocks the logic one at the D input of Flip-Flop 168 to its Q output. The logic one at the Q output of Flip-Flop 168 is then clocked through Flip-Flop 168 by a clock pulse of the 2.4 megahertz CLK1 signal supplied to the CLK input of Flip-Flop 168. The logic one occurring at the Q output of Flip-Flop 168 is next supplied to an inverter 172 which inverts the logic one to a logic zero resulting in the logic zero being provided to the CLRN input of Flip-Flop 168 resetting the Q output of Flip-Flop 168 to the logic zero state. This results in positive pulse generating circuit 54 generating a pulse which is the reset pulse signal for counters 58 and 66. In a like manner, the NCLR pulse of FIG. 3 is supplied to counters 60 and 68 to reset counters 60 and 68.

Figure 8:
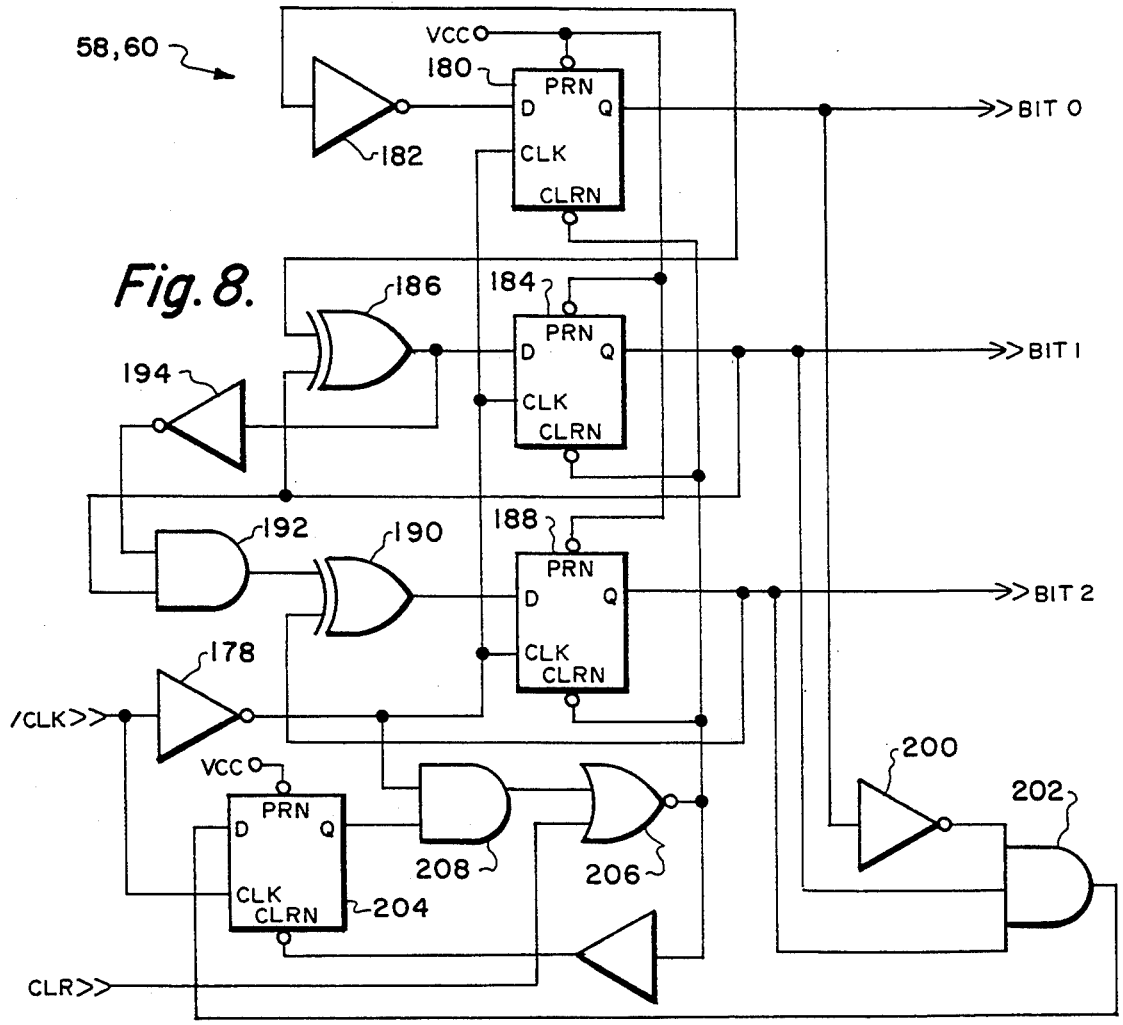
FIG. 8 is a detailed logic diagram of the three bit counter of the circuit of FIG. 2.

Referring to FIGS. 2a, 2b and 8, counters 58 and 60 provide read and write addressing to register 62. Counter 58 is clocked by a READ3 signal, FIG. 10, provided by state machine 56, while counter 60 is clocked by a doppler convert (DOPP_CONV) signal, FIG. 10, provided by state machine 42.

The following discussion is with respect to the operation of counter 58 although it should be understood that the operation of counter 60 is identical to that of counter 58.

After counter 58 is reset the Q outputs of Flip-Flops 180, 184 and 188 are at the logic zero state which is the first read address for register 62.

State machine 56 provides the READ3 signal to inverter 178 which inverts the READ3 signal of FIG. 10 and then supplies the inverted READ3 signal to the clock input of Flip-Flops 180, 184 and 188. The first clock pulse of the inverted READ3 signal occurring after counter 58 is reset will clock the logic one at the output of inverter 182 through Flip-Flop 180 which results in a logic one at the Q output of Flip-Flop 180 and logic zeros at the Q outputs of Flip-Flops 184 and 188. This, in turn, is the second read address for register 62.

The logic one at the Q output of Flip-Flop 180 is inverted by inverter 182 resulting in a logic zero at the D input of Flip-Flop 180. The logic one at the Q output of Flip-Flop 180 is also supplied to the first input of an EXCLUSIVE-OR gate 186 while a logic zero is supplied to the second input of EXCLUSIVE-OR gate 186. This results in a logic one occurring at the output of EXCLUSIVE-OR gate 186 which is then supplied to the D input of Flip-Flop 184. A second clock pulse of the inverted READ3 signal clocks the logic zero at the D inputs of Flip-Flop 180 and 188 to their Q outputs and the logic one at the D input of Flip-Flop 184 to its Q output resulting in the third read address for register 62.

Inverter 182 inverts the logic zero occurring at the D output of Flip-Flop 180 to a logic one resulting in logic ones at the D inputs of Flip-Flops 180 and 184. A third clock pulse of the inverted READ3 signal will clock the logic ones to the Q outputs of Flip-Flops 180 and 184 and the logic zero at the D input of Flip-Flop 188 to its Q output which results in the fourth read address for register 62.

EXCLUSIVE-OR gate 186 is now at the logic zero state since logic ones are being supplied to its first and second inputs. This logic zero is supplied to an inverter 194 resulting in a logic one at its output. The logic one occurring at the D output of Flip-Flop 184 is supplied to the first input of an AND gate 192 while the second input of AND gate 192 receives the logic one occurring at the output of inverter 194. A fourth clock pulse of the inverted READ3 signal will clock the logic zeros at the D inputs of Flip-Flops 180 and 184 to their respective Q outputs and the logic one at the D input of Flip-Flop 188 to its Q output. This results in the fifth read address for register 62.

Counter 58 continuous to provide read addressing to register 62 until the output of Flip-Flop 180 transitions to the logic zero state, the output of Flip-flop 184 transitions to the logic one state and the output of Flip-Flop 188 is at the logic one state. The logic zero at the output of Flip-Flop 180 is supplied to an inverter 200 which inverts the zero to a logic one resulting in a logic one at the first input of an AND gate 202. Since the second and third inputs of AND gate 202 are also at the logic one state the output of AND gate 202 will be at the logic one state resulting in a logic one at the D input of Flip-Flop 204. This logic one is clocked through Flip-Flop 204 to its Q output by the READ3 signal of FIG. 10. This logic one is supplied to AND gate 208 enabling AND gate 208 allowing the next logic one pulse of the inverted READ3 signal to pass through AND gate 208 to NOR gate 206. NOR gate 206 inverts this logic one pulse to a logic zero pulse which when provided to the CLRN inputs of Flip-Flops 180, 184, 188 and 204 resets Flip-Flops 180, 184, 188 and 204. It should also be noted that Flip-Flops 180, 184, 188 and 204 are reset by the pulse provided by positive pulse generating circuit 54.

At this time it should be noted that counter 60, which operates in a manner similar to counter 58, provides write addressing to register 62. It should also be noted that counter 60 is reset by the pulse provided by negative pulse generating circuit 52.

Figure 9:
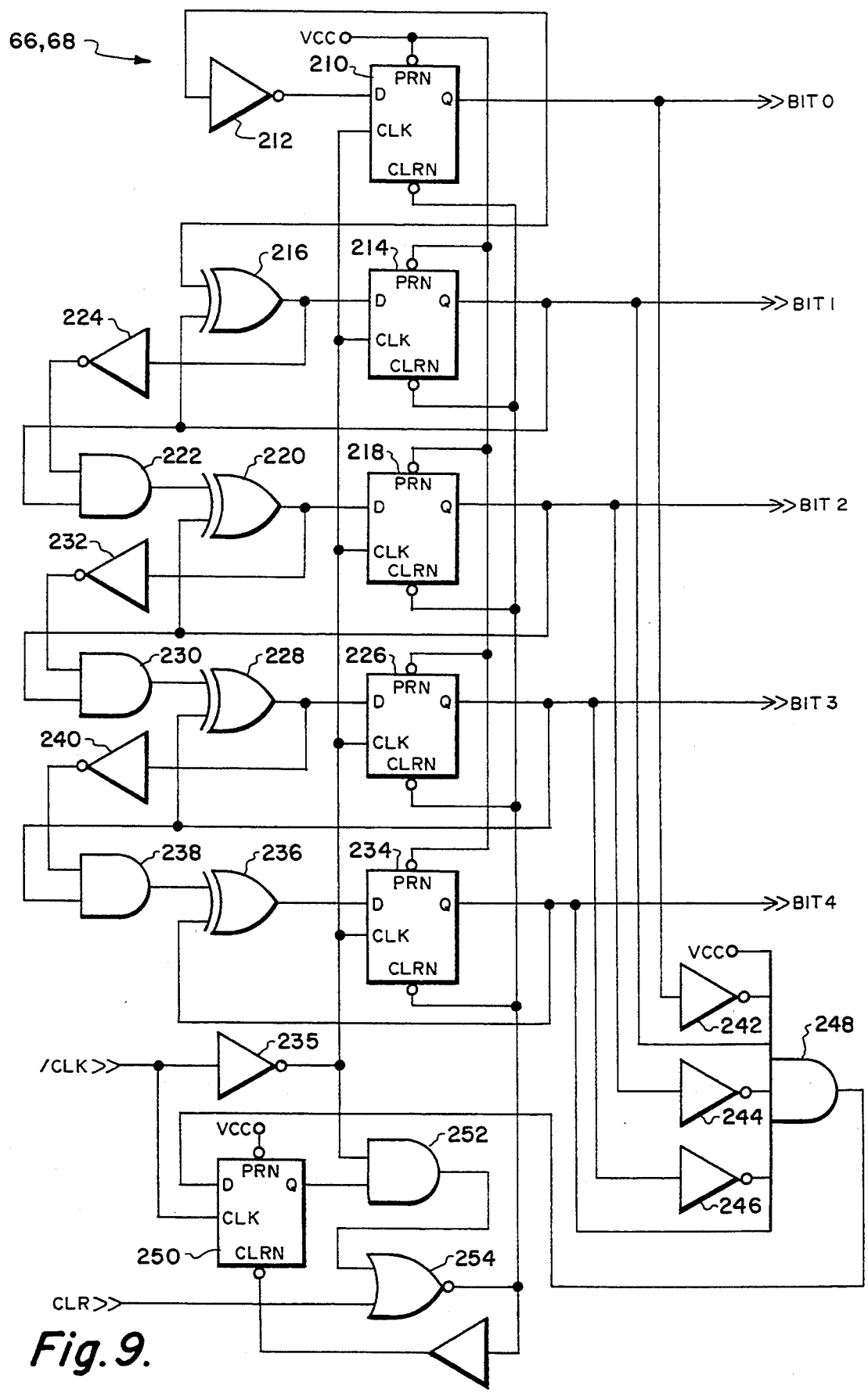
FIG. 9 is a detailed logic diagram of the five bit counter of the circuit of FIG. 2.

Referring to FIGS. 2a, 2b and 9, counters 66 and 68 provide read and write addressing to register 70. The READ1 signal of FIG. 10 when at the logic one state enables AND gate 64. When AND gate 64 is enabled Counter 66 is clocked by an inversion of the 2.4 megahertz system clock of FIG. 10. Counter 68 is clocked by the doppler convert (DOPP_CONV) signal, FIG. 10, provided by state machine 42.

The following discussion is with respect to the operation of counter 66 although it should be understood that the operation of counter 66 is identical to that of counter 68.

After counter 66 is reset the Q outputs of Flip-Flops 210, 214, 218, 226 and 234 are at the logic zero state which is the first read address for register 70.

The inverted 2.4 megahertz system clock signal is supplied through AND gate 64 to inverter 235 which inverts this signal and then supplies the 2.4 megahertz system clock signal to the clock input of Flip-Flops 210, 214, 218, 226 and 234. The first clock pulse of the 2.4 megahertz system clock signal of FIG. 10 occurring after counter 66 is reset will clock the logic one at the output of inverter 212 through Flip-Flop 210 which results in a logic one at the Q output of Flip-Flop 210 and logic zeros at the Q outputs of Flip-Flops 214, 218, 226 and 234. This, in turn, is the second read address for register 70.

The logic one at the Q output of Flip-Flop 210 is inverted by inverter 212 resulting in a logic zero at the D input of Flip-Flop 210. The logic one at the Q output of Flip-Flop 210 is also supplied to the first input of an EXCLUSIVE-OR gate 216 while a logic zero is supplied to the second input of EXCLUSIVE-OR gate 216. This results in a logic one occurring at the output of EXCLUSIVE-OR gate 216 which is then supplied to the D input of Flip-Flop 214. A second clock pulse of the 2.4 megahertz system signal clocks the logic zero at the D inputs of Flip-Flops 210, 218, 226 and 234 to their Q outputs and the logic one at the D input of Flip-Flop 214 to its Q output resulting in the third read address for register 70.

Inverter 212 inverts the logic zero occurring at the D output of Flip-Flop 210 to a logic one resulting in logic ones at the D inputs of Flip-Flops 210 and 214. A third clock pulse of the 2.4 megahertz system clock signal the logic ones to the Q outputs of Flip-Flops 210 and 214 and the logic zeros at the D inputs of Flip-Flops 218, 226 and 234 to their Q outputs which results in the fourth read address for register 70.

EXCLUSIVE-OR gate 216 is now at the logic zero state since logic ones are being supplied to its first and second inputs. This logic zero is supplied to an inverter 224 resulting in a logic one at its output. The logic one occurring at the D output of Flip-Flop 214 is supplied to the first input of an AND gate 222 while the second input of AND gate 222 receives the logic one occurring at the output of inverter 224. A fourth clock pulse of the 2.4 megahertz system clock signal will clock the logic zeros at the D inputs of Flip-Flops 210, 214, 226 and 234 to their respective Q outputs and the logic one at the D input of Flip-Flop 218 to its Q output. This results in the fifth read address for register 70.

Counter 66 continuous to provide read addressing to register 70 until the outputs of Flip-Flops 210, 218 and 226 are at the logic zero state and the outputs of Flip-Flops 214 and 234 are at the logic one state. The logic zero at the output of Flip-Flop 210 is supplied to an inverter 242, the logic zero at the output of Flip-Flop 218 is supplied to an inverter 244 and the logic zero at the output of Flip-Flop 226 is supplied to an inverter 246. Inverters 242, 244 and 246 invert each of these logic zeros to logic ones resulting in logic ones at each of the inputs of an AND gate 248. This results in a logic one at the output of AND gate 248 which is then supplied to the D input of Flip-Flop 250. This logic one is clocked through Flip-Flop 250 to its Q output by the inverted 2.4 megahertz system clock signal. This logic one is then supplied to AND gate 252 enabling AND gate 252 allowing the next logic one pulse of the 2.4 megahertz system clock signal of FIG. 10 to pass through AND gate 252 to NOR gate 254. NOR gate 254 inverts this logic one pulse to a logic zero pulse which when provided to the CLRN inputs of Flip-Flops 210, 214, 218, 226, 234 and 250 resets Flip-Flops 210, 214, 218, 226, 234 and 250. It should also be noted that Flip-Flops 210, 214, 218, 226, 234 and 250 are reset by the pulse provided by positive pulse generating circuit 54.

At this time it should be noted that counter 68, which operates in a similar manner to counter 66, provides write addressing to register 70. Counter 68, however, is reset by a pulse from negative pulse generating circuit 52.

Referring now to FIGS. 1, 2a, 2b and 11a–11d, there is shown an adder, designated generally by the reference numeral 260, which adds the six bit equivalent signal of the analog data signal to the dither component provided by EPROM 30 and then provides a three bit signal at its SUM3–SUM5 outputs.

Adder 260 comprises a carry circuit 262 which provides a carry bit in accordance with the following logic equations:

$$COUT = C2 \cdot A2 + A2 \cdot B2 + C2 \cdot B2 \tag{1}$$

where, $$C2 = C1 \cdot A1 + A1 \cdot B1 + C1 \cdot B1 \tag{2}$$

$$C1 = A0 \cdot B0 \tag{3}$$

and where COUT is the output of OR gate 286; C1 is the output of AND gate 272; C2 is the output of OR gate 278 and A0, A1, A2, B0, B1 and B2 are inputs to carry circuit 262. The logic signals provided to the A0, A1 and A2 inputs of carry circuit 262 are the three least significant bits of the dither component provided by EPROM 30, while the logic signals provided to the B0, B1 and B2 inputs of carry circuit 262 are the three least significant bits of the equivalent six bit digital signal.

The carry bit from circuit 262 is supplied to the CIN input of a summing circuit 264. Summing circuit 264 then provides a sum bit and a carry bit in accordance with the following logic equations:

$$SUM = X \oplus Y \oplus CIN \quad (4)$$

$$COUT = X \cdot Y + X \cdot CIN + Y \cdot CIN \quad (5)$$

where SUM is the output of EXCLUSIVE-OR circuit 298, COUT is the output of OR gate 300, X is the fourth least significant bit of the six bit dither component, Y is the fourth least significant bit of the equivalent six bit digital signal and CIN is the carry bit.

The sum bit occurring at the SUM output of circuit 264, which represents the addition of the fourth least significant bit of the dither component, the fourth least significant bit of the equivalent six bit digital signal and the carry bit, is supplied to a clipping circuit 270. The carry bit is supplied to the CIN input of summing circuit 266.

Summing circuit 266 is identical to summing circuit 264 and utilizes equation (4) and (5) to calculate the sum bit and carry bit. The sum bit occurring at the SUM output of circuit 266, which represents the addition of the fifth least significant bit of the dither component, the fifth least significant bit of the equivalent six bit digital signal and the carry bit, is also supplied to a clipping circuit 270. The carry bit is supplied to the CIN input of summing circuit 268.

Summing circuit 268 is also identical to summing circuit 264 and utilizes equation (4) and (5) to again calculate the sum bit and carry bit. The sum bit occurring at the SUM output of circuit 268, which represents the addition of the sixth least significant bit of the dither component, the sixth least significant bit of the equivalent six bit digital signal and the carry bit, is also supplied to a clipping circuit 270. The carry bit is supplied to the COUT input of clipping circuit 270.

Clipping circuit 270 provides the three bit digital equivalent of the six bit digital equivalent signal supplied to circuit 20. Clipping circuit 270 operates in accordance with the following truth table.

| TRUTH TABLE CLIPPING CIRCUIT 270 | | | | | | | |
|---|---|---|---|---|---|---|---|
| INPUT | | | | | OUTPUT | | |
| D0 | D1 | D2 | COUT | D07 | OD0 | OD1 | OD2 |
| D0 | D1 | D2 | 0 | 0 | D0 | D1 | D2 |
| D0 | D1 | D2 | 0 | 1 | 0 | 0 | 0 |
| D0 | D1 | D2 | 1 | 0 | 1 | 1 | 1 |
| D0 | D1 | D2 | 1 | 1 | D0 | D1 | D2 |

When for example the sign bit is a logic zero and the carry bit is zero, logic ones will be supplied to the first inputs of NAND gates 302, 304 and 306 as well as the first inputs of NAND gates 308, 310 and 312. This allows the bits at the D0, D1 and D2 inputs of clipping logic circuit 270 to pass through NAND gates 302, 304 and 306 and then through NAND gates 308, 310 and 312 to the OD0, OD1 and OD2 outputs of circuit 270.

Similarly, when the sign bit is a logic one and the carry bit is one, logic ones will be supplied to the first inputs of NAND gates 302, 304 and 306 as well as the first inputs of NAND gates 308, 310 and 312. This again allows the bits at the D0, D1 and D2 inputs of clipping logic circuit 270 to pass through NAND gates 302, 304 and 306 and through NAND gates 308, 310 and 312 to the OD0, OD1 and OD2 outputs of circuit 270.

In a similar manner, when the sign bit is a logic one and the carry bit is a logic zero, a logic zero is supplied to the first inputs of NAND gates 302, 304 and 306 resulting in logic ones at the outputs of NAND gates 302, 304 and 306. Since the output of NAND gate 320 is also a logic one, logic ones are now being supplied to the first and second inputs of NAND gates 308, 310 and 312 resulting logic zeros at the outputs of NAND gates 308, 310 and 312. These logic zeros are next provided to the OD0, OD1 and OD2 outputs of circuit 270.

Similarly, when the sign bit is a logic zero and the carry bit is a logic one, the output of NAND gate 320 is at the logic zero state resulting in logic zeros being provided to the first inputs of NAND gates 308, 310 and 312. This, in turn, results in logic ones occurring at the outputs of NAND gates 308, 310 and 312. These logic ones are next provided to the OD0, OD1 and OD2 outputs of circuit 270.

Referring to FIGS. 2a, 2b, 4c, 12a, 12b, 12c and 12d, when the FUZE_ACT input of circuit 26 is a logic zero, the DOPP_SEL input of circuit 26 transitions to a logic one state and state machine 42 provides a logic one to the S21 input of state machine 56, state machine 56 will generate the READ3 signal of FIG. 10 initiating a read operation for 7×3 register 62. The READ3 signal of FIG. 10 is supplied to the READ input of 7×3 register 62 and the /CLK input of counter 58.

Counter 58, in response to the one to zero transition of a pulse of the READ3 signal of FIG. 10, generates a read address for register 62. When, for example, the read address supplied by counter 62 to the A, B and C inputs of 3-Line to 8-Line decoder 322 is 0, 0, 0, the Y0N output of decoder 322 will transition to the logic zero state. This logic zero is supplied to the /ENA-READ input of 1×3 register 326. Inverter 350 of register 326 next inverts the logic zero to a logic one which is then supplied to the first input of AND gate 354 enabling AND gate 354 of register 326. When the next pulse of READ3 signal of FIG. 10 is supplied through the READ input of register 62 to the second input of AND gate 354, the output of AND gate 354 will transition to the logic one state resulting in logic ones being provided to the first inputs of AND gates 356, 358 and 360. This enables AND gates 356, 358 and 360 of register 326 allowing the data bits stored in Flip-Flops 342, 344 and 346 to pass through AND gates 356, 358 and 360 of register 326 and then through OR gates 362, 364 and 366 of OR gate circuit 340 to the BIT1, BIT2 and BIT3 inputs of a parallel to serial converter 72. The data bits stored in registers 328, 330, 332, 334, 336 and 338 are read from these register in a similar manner with the particular 1×3 register 328, 330, 332, 334, 336 or 338 from which data is to be read being determined by the address provided to decoder 322 by counter 58.

During a write operation three bit data from binary adder 46 is written into register 62. State machine 42 generates the DOPP_CONV signal of FIG. 10 which is supplied to the /CLK input of counter 60 as well as the WRITE input of register 62. Counter 60, in response to the one to zero transition of a pulse of the DOPP_CONV signal of FIG. 10, generates a write address for register 62. When, for example, the write address supplied by counter 62 to the A, B and C inputs of 3-Line to 8-Line decoder 324 is 0, 0, 0, the Y0N output of decoder 324 will transition to the logic zero state. This logic zero is supplied to the /ENAWRT input of 1×3 register 326. Inverter 348 of register 326 next inverts the logic zero to a logic one which is then supplied to the first input of AND gate 352 enabling AND gate 352 of register 326. When the next pulse of DOPP_CONV signal of FIG. 10 is supplied through the WRITE input of register 62 to the second input of AND gate 352, the output of AND gate 352 will transition from the logic zero state to the logic one state resulting in the three data bits from adder 46 being written or clocked into Flip-Flops 342, 344 and 346 of register 326. Data to be written into registers 328, 330, 332, 334, 336 and 338 is written into these register in a similar manner with the particular 1×3 register 328, 330, 332, 334, 336 or 338 which data is to be written into being determined by the address provided to decoder 324 by counter 60.

Referring to FIGS. 2a, 2b, 4c, 13a, 13b, 13c, 13d and 13e when the FUZE_ACT input of circuit 26 is a logic one, the DOPP_SEL input of circuit 26 transitions to a logic one state and state machine 42 provides a logic one to the S21 input of state machine 56, state machine 56 will generate a logic one READ1 signal initiating a read operation for 19×1 register 70. The logic one READ1 signal is supplied to AND gate 64 enabling AND gate 64. This allows the inversion of the system clock signal of FIG. 10 to pass through AND gate 64 to the READ input of 19×1 register 70 and the /CLK input of counter 66.

Counter 66, in response to the one to zero transition of a pulse of the inverted system clock signal, generates a read address for register 70. When, for example, the read address supplied by counter 66 to the ADDR0, ADDR1, ADDR2, ADDR3 and ADDR4 inputs of decoder circuit 370 is respectively 0, 0, 0, 0, 0, logic zeros are provided to the first and second inputs of NOR gate 426 resulting in a logic one at the output of NOR gate 426 which is supplied to the G1 input of 3-Line to 8-Line decoder 427 enabling decoder 427. The logic zero at the ADDR4 input of decoder circuit 370 is supplied to AND gate 430 resulting in a logic zero at the output of AND gate 430 which is then supplied to the G1 input of 3-Line to 8-Line decoder 429 disabling decoder 429. In a like manner, the logic zero at the ADDR3 input of decoder circuit 370 is supplied to AND gate 434 resulting in a logic zero at the output of AND gate 434 which is then supplied to the G1 input of 3-Line to 8-Line decoder 431 disabling decoder 431.

Since only decoder 427 is enabled and the A, B and C inputs of decoder 427 are respectively 0, 0, 0 the Y0N output of circuit 427 will transition to the logic zero state. This logic zero is then supplied to the /ENAREAD input of 1×1 Register 374. Inverter 418 of register 374 next inverts the logic zero to a logic one which is then supplied to the first input of AND gate 420 enabling AND gate 420 of register 374. When the next pulse of inversion of the system clock signal of FIG. 10 is supplied through the READ input of register 70 to the second input of AND gate 420, the output of AND gate 420 of register 374 will transition to the logic one state resulting in a logic one being provided to the first input of AND gate 424. This enables AND gates 424 of register 374 allowing the data bit stored in Flip-Flop 422 to pass through AND gate 424 of register 326 and then through OR gates 436 and OR gate 442 of OR gate circuit 412 to the BIT3A input of parallel to serial converter 72. The data bit stored in 1×1 registers 376, 378, 380, 382, 384, 386, 388, 390, 392, 394, 396, 398, 400, 402, 404, 406, 408 and 410 is read from these register in a similar manner with the particular 1×1 register 376, 378, 380, 382, 384, 386, 388, 390, 392, 394, 396, 398, 400, 402, 404, 406, 408 and 410 from which data is to be read being determined by the address provided to decoder 322 by counter 58.

During a write operation one bit data from binary adder 46 is written into register 70. State machine 42 generates the DOPP_CONV signal of FIG. 10 which is supplied to the /CLK input of counter 68 as well as the WRITE input of register 62. Counter 68, in response to the one to zero transition of a pulse of the DOPP_CONV signal of FIG. 10, generates a write address for register 70. When, for example, the write address supplied by counter 68 to the ADDR0, ADDR1, ADDR2, ADDR3 and ADDR4 inputs of decoder circuit 372 is respectively 0, 0, 0, 0, 0, logic zeros are provided to the first and second inputs of NOR gate 426 resulting in a logic one at the output of NOR gate 426 which is supplied to the G1 input of 3-Line to 8-Line decoder 427 enabling decoder 427. The logic zero at the ADDR3 input of decoder circuit 370 is supplied to AND gate 430 resulting in a logic zero at the output of AND gate 430 which is then supplied to the G1 input of 3-Line to 8-Line decoder 429 disabling decoder 429. In a like manner, the logic zero at the ADDR4 input of decoder circuit 372 is supplied to AND gate 434 resulting in a logic zero at the output of AND gate 434 which is then supplied to the G1 input of 3-Line to 8-Line decoder 431 disabling decoder 431.

This logic zero from the R0 output of decoder circuit 372 is supplied to the /ENAWRT input of 1×1 register 374. Inverter 414 of register 374 next inverts the logic zero to a logic one which is then supplied to the first input of AND gate 416 enabling AND gate 416 of register 374. When the next pulse of DOPP_CONV signal of FIG. 10 is supplied through the WRITE input of register 70 to the second input of AND gate 416, the output of AND gate 416 will transition from the logic zero state to the logic one state resulting in the one data bit from adder 46 being written or clocked into Flip-Flop 422 of register 374. Data to be written into 1×1 registers 376, 378, 380, 382, 384, 386, 388, 390, 392, 394, 396, 398, 400, 402, 404, 406, 408 and 410 is written into these register in a similar manner with the particular 1×1 register 376, 378, 380, 382, 384, 386, 388, 390, 392, 394, 396, 398, 400, 402, 404, 406, 408 or 410 which data is to be written into being determined by the address provided to decoder 372 by counter 68.

Referring to FIGS. 1, 2a, 2b and 14 when one bit equivalent data is to be provided by circuit 20, the FUZE_ACT line to circuit 26 is at the logic one state resulting in a logic one at the FA input of state machine 56. State machine 56, in response to this logic one, generates the logic one READ1 signal which is supplied to the READ1 input of parallel to serial converter 72. This logic one READ1 signal is then supplied to the first input of AND gate 478 enabling AND gate 478 and inverter 476 which inverts the logic one to a logic zero. The logic zero is next supplied to the first input of AND gate 474 disabling AND gate 474. The logic READ1 signal is also supplied to the first inputs of NAND gates 464 and 466 enabling these AND gates.

When a data bit is read from register 70 the data bit passes through the BIT3A input of parallel to serial converter 72 to the second input of NAND gate 464. If, for example, the data bit is a logic one then the output of NAND gate 464 will be at the logic zero state resulting in a logic one being supplied to the PRN (preset) input of Flip-Flop 470. This sets the Q output of Flip-Flop 470 to the logic one state resulting in a logic one being provided to the D input of Flip-Flop 472. The 2.4 megahertz system clock signal of FIG. 10 will next clock the logic one data bit to the Q output of Flip-Flop 472. The logic one data bit then passes through AND gate 478, OR gate 480, tri-state buffer 71 and the SERIAL_OUT output of circuit 26 to the DATA_OUT output of circuit 20.

When, however, the data bit from register 70 is a logic zero, the output of NAND gate 464 will be at the logic one state resulting in logic ones at the first and second inputs of NAND gate 466. The output of NAND gate 466 will now be a logic zero state which is supplied to the CLRN (clear) input of Flip-Flop 470. This sets the Q output of Flip-Flop 470 to the logic zero state resulting in a logic zero being provided to the D input of Flip-Flop 472. The 2.4 megahertz system clock signal of FIG. 10 will next clock the logic zero data bit to the Q output of Flip-Flop 472. The logic zero data bit then passes through AND gate 478, OR gate 480, tri-state buffer 71 and the SERIAL_OUT output of circuit 26 to the DATA_OUT output of circuit 20.

When three bit equivalent data is provided by circuit 20, the FUZE_ACT line to circuit 26 is at the logic zero state resulting in a logic zero at the FA input of state machine 56. State machine 56, in response to this logic one, provides a logic zero READ1 signal (illustrated in FIG. 10) which is supplied to the READ1 input of parallel to serial converter 72. This logic zero is then supplied to the first input of AND gate 478 disabling AND gate 478 and inverter 476 which inverts the logic zero to a logic one. The logic one is next supplied to the first input of AND gate 474 enabling AND gate 474.

State machine 56 also generates the READ3 signal of FIG. 10 when three bit equivalent data is to be read from 7×3 register 62. The logic one portion of a pulse of the READ3 signal of FIG. 10 when supplied to the first inputs of NAND gates 444, 446, 448 and 450 enables NAND gates 444, 446, 448 and 450. Enabling NAND gates 444 and 446 allows data bits previously provided to the BIT 2 and BIT 3 inputs of converter 72 to be inverted respectively by NAND gates 444 and 446.

When, for example, the logic bits at the BIT1, BIT2, BIT3 input of converter 72 are respectively 1, 1, 0, and a READ3 pulse of the READ3 signal of FIG. 10 transitions to the logic one state, the logic one at BIT1 input of converter 72 will pass through OR gate 462 to the D input of Flip-Flop 468. Similarly, after the READ3 pulse transitions to the logic one state, the logic one data bit at the BIT2 input of converter 72 will be inverted by NAND gate 446 resulting in a logic zero at the PRN input of Flip-Flop 454 which sets the Q output of Flip-Flop 454 to the logic one state. The logic zero data bit at the BIT3 input of converter 72 is inverted to a logic one and then supplied to the second input of NAND gate 448 which inverts the logic one to a logic zero. This logic zero is next supplied to the CLRN input of Flip-Flip 452 setting the Q output of Flip-Flop 452 to a logic zero state.

The leading edge of the first clock pulse of the system clock signal occurring after the three data bits are provided to Flip-Flops 468, 454 and 452 will clock the logic one data bit at the D input of Flip-Flop 468 to its Q output and then through AND gate 474, OR gate 480 and tri-state buffer 71 to the SERIAL_OUT output of circuit 20. After the READ3 pulse transitions to the logic zero state, inverter 458 will inverts this logic zero to a logic one which is then supplied to the first inputs of AND gates 456 and 460 enabling AND gates 456 and 460. Since AND gate 460 is now enabled the logic one data bit at the Q output of Flip-Flop 454 passes through AND gate 460 and OR gate 462 to the D input of Flip-Flop 468. The logic zero data bit at the Q output of Flip-Flop 452 is also supplied to the D input of Flip-Flop 454.

The leading edge of the next pulse of the system clock signal of FIG. 10 will clock the logic one data bit through Flip-Flop 468 to its Q output and the logic zero data bit through Flip-Flop 454 to its Q output. The logic one data bit then passes through AND gate 474, OR gate 480 and tri-state buffer 71 to the SERIAL_OUT output of circuit 20. The logic zero data bit at the Q output of Flip-Flop 454 is supplied through AND gate 460 and OR gate 462 to the D input of Flip-Flop 468. A third successive pulse of the clock signal of FIG. 10 will clock this logic zero data bit through Flip-Flop 468 and then through AND gate 474, OR gate 480 and tri-state buffer 71 to the SERIAL_OUT output of circuit 20.

From the foregoing, it may be readily be seen that the present invention comprises a new, unique and exceedingly useful digital circuit which may be used to add a dither component to the digital equivalent word of an incoming analog signal so as to reduce noise and distortion in the digital equivalent signal. Obviously many modifications and variations of the present invention are possible in light of the above teachings. It is therefore to be understood that within the scope of the appended claims that the invention may be practiced otherwise than as specifically described.

What is claimed is:

1. An electronic circuit for use with a telemetry system, said telemetry system providing a fuze active logic signal, a system clock signal and a doppler select signal, said electronic circuit comprising:

an input terminal for receiving an analog signal to be digitized;

programmed read only memory means for generating a digital dither signal of six bit dither words and sign bits indicative of when said six bit dither words are positive and when said six bit dither words are negative;

an analog to digital converter connected to said input terminal for converting said analog signal from analog to digital form to provide a digital data signal of six bit data words;

an adder circuit connected to said analog to digital converter and said read only memory means for adding said digital dither signal and said digital data signal to produce a first digital equivalent signal of three bit data/dither words and a second digital equivalent signal, said second digital equivalent signal being a most significant bit of each three bit data/dither word of said first digital equivalent signal;

means for inverting said system clock signal to provide an inverted system clock signal;

first state machine circuit means responsive to said inverted system clock signal, said doppler select signal and said fuze active logic signal generating a read three bit signal when said fuze active logic signal is at a first logic state and a read one bit signal when said fuze active logic signal is at a second logic state;

second state machine circuit means responsive to said system clock signal generating a doppler convert signal;

first storage means connected to said first state machine circuit means, said second state machine circuit means and said adder circuit, said first storage means receiving said first digital equivalent signal from said adder circuit;

gating means connected to said first state machine circuit means and said inverting means, for receiving said read one bit signal and said inverted system clock signal, said read one bit signal enabling said gating means allowing said inverted system clock signal to pass through said gating means;

second storage means connected to said gating means, said second state machine circuit means and said adder circuit, said second storage means receiving said second digital equivalent signal from said adder circuit;

said first and second state machine means receiving said doppler convert signal from said second state machine circuit means, said doppler convert signal effecting a continuous storage of said first digital equivalent signal in said first storage means and said second digital equivalent signal in said second storage means; and a parallel to serial converter circuit connected to said first storage means, said second storage means and said first state machine circuit means;

said first storage means responsive to said read three bit signal retrieving said first digital equivalent signal stored in said first storage means and then transferring said first digital equivalent signal to said parallel to serial converter circuit;

said parallel to serial converter circuit responsive to said read three bit signal and said system clock signal converting said first digital equivalent signal from parallel form to serial form to provide a first serial digital output signal;

said second storage means responsive to said inverted system clock signal provided by said gating means when said gating means is enabled retrieving said second digital equivalent signal stored in said second storage means and then transferring said second digital equivalent signal to said parallel to serial converter circuit;

said parallel to serial converter circuit responsive to said read one bit signal and said system clock signal passing said second digital equivalent signal through said parallel to serial converter circuit to provide a second serial digital output signal.

2. The electronic circuit of claim 1 further comprising:

a first read address generating counter connected to said first state machine circuit means and said first storage means, said first read address generating counter responsive to said read three bit signal providing a plurality of read three bit addresses to said first storage means;

a second read address generating counter connected to said gating means and said second storage means, said second read address generating counter responsive to said inverted system clock signal provided by said gating means when said gating means is enabled providing a plurality of read one bit addresses to said second storage means;

a first write address generating counter connected to said second state machine circuit means and said first storage means, said first write address generating means responsive to said doppler convert signal providing a plurality of write three bit addresses to said first storage means; and a second write address generating counter connected to said second state machine circuit means and said second storage means, said second write address generating means responsive to said doppler convert signal providing a plurality of write one bit addresses to said second storage means.

3. The electronic circuit of claim 1 wherein said gating means comprises an AND gate having a first input connected to said first state machine circuit means, a second input connected to said inverting means and an output connected to said second storage means.

4. The electronic circuit of claim 1 wherein said adder circuit comprises:

a carry bit generating circuit having six data inputs for receiving three least significant dither bits of the six bit dither words of said digital dither signal and three least significant data bits of the six bit data words of said digital data signal, said carry bit generating circuit adding the three least significant bits of said digital dither signal to the three least significant bits of said digital data signal to provide a first carry bit;

a first summing circuit having three inputs for receiving a fourth dither bit of the six bit dither words of said digital dither signal, a fourth data bit of the six bit data words of said digital data signal and said first carry bit, said first summing circuit adding said fourth dither bit and said first carry bit to said fourth data bit to provide a first data/dither bit of the three bit data/dither words of said first digital equivalent signal and a second carry bit;

a second summing circuit having three inputs for receiving a fifth dither bit of the six bit dither words of said digital dither signal, a fifth data bit of the six bit words of said digital data signal and said second carry bit, said second summing circuit adding said fifth dither bit and said second carry bit to said fifth data bit to provide a second data/dither bit of the three bit data/dither words of said first digital equivalent signal and a third carry bit;

a third summing circuit having three inputs for receiving a sixth dither bit of the six bit dither words of said digital dither signal, a sixth data bit of the six bit data words of said digital data signal and said third carry bit, said third summing circuit adding said sixth dither bit and said third carry bit to said sixth data bit to provide a third data/dither bit of the three bit data/dither words of said first digital equivalent signal and a fourth carry bit; and a clipping circuit having five inputs for receiving said first, second and third data/dither bits of the three bit data/dither words of said first digital equivalent signal, said fourth carry bit, and said sign bits;

said clipping circuit responsive to said fourth carry bit and said sign bits passing the three bit data/dither words of said first digital equivalent signal therethrough or clipping said first, second and third data/dither bits of the three bit data/dither words of said first digital equivalent signal to a predetermined logic state.

5. The electronic circuit of claim 4 wherein said first, second and third summing circuits each comprise:

a first EXCLUSIVE-OR circuit 290 having a first input connected to said programmed read only memory means, a second input connected to said analog to digital converter and an output;

a second EXCLUSIVE-OR circuit 298 having a first input connected to said first EXCLUSIVE-OR circuit 290, a second input for receiving one of said first, second and third carry bits and an output connected to one of the five inputs of said clipping circuit;

a first AND gate 292 having a first input connected to said programmed read only memory means, a second input connected to said analog to digital converter and an output;

a second AND gate 294 having a first input connected to said analog to digital converter, a second input for receiving one of said first, second and third carry bits and an output;

a third AND gate 296 having a first input connected to said programmed read only memory means, a second input for receiving one of said first, second and third carry bits and an output; and an OR gate 300 having a first input connected to the output of said first AND gate 292, a second input connected to the output of said second AND gate 294, a third input connected to the output of said third AND gate 296 and an output connected to another of the five inputs of said clipping circuit.

6. The electronic circuit of claim 4 wherein said clipping circuit comprises:

a first NAND gate 302 having a first input connected to said first summing circuit for receiving said first data/dither bit, a second input and an output;

a second NAND gate 304 having a first input connected to said second summing circuit for receiving said second data/dither bit, a second input and an output;

a third NAND gate 306 having a first input connected to said third summing circuit for receiving said third data/dither bit, a second input and an output;

a first inverter 314 having an input connected to said third summing circuit for receiving said fourth carry bit and an output;

a second inverter 316 having an input connected to said programmed read only memory means for receiving said sign bits and an output;

a fourth NAND gate 318 having a first input connected to the output of said first inverter, a second input connected to said programmed read only memory means for receiving said sign bits and an output connected to the second input of said first NAND gate 302, the second input of said second NAND gate 304 and the second input of said third NAND gate 306;

a fifth NAND gate 320 having a first input connected to said third summing circuit for receiving said fourth carry bit, a second input connected to the output of said second inverter 316 and an output;

a sixth NAND gate 308 having a first input connected to the output of said first NAND gate 302, a second input connected to the output of said fifth NAND gate 320 and an output;

a seventh NAND gate 310 having a first input connected to the output of said second NAND gate 304, a second input connected to the output of said fifth NAND gate 320 and an output; and an eighth NAND gate 312 having a first input connected to the output of said third NAND gate 306, a second input connected to the output of said fifth NAND gate 320 and an output;

the output of sixth NAND gate 308, the output of said seventh NAND gate 310 and the output of said eighth NAND gate 312 providing said first digital equivalent signal of three bit data/dither words;

7. The electronic circuit of claim 4 wherein said carry bit generating circuit comprises:

a first AND gate 272 having a first input connected to said programmed read only memory means, a second input connected to said parallel to serial converter circuit and an output;

a second AND gate 274 having a first input connected to the output of said first AND gate 272, a second input connected to said programmed read only memory means and an output;

a third AND gate 276 having a first input connected to said programmed read only memory means, a second input connected to said parallel to serial converter circuit and an output;

a fourth AND gate 277 having a first input connected to said parallel to serial converter circuit, a second input connected to the output of said first AND gate 272 and an output;

a first OR gate 278 having a first input connected to the output of said second AND gate 274, a second input connected to the output of said third AND gate 276, a third input connected to the output of fourth AND gate 277 and an output;

a fifth AND gate 280 having a first input connected to the output of first OR gate 280, a second input connected to said programmed read only memory means and an output;

a sixth AND gate 282 having a first input connected to said programmed read only memory means, a second input connected to said parallel to serial converter circuit and an output;

a seventh AND gate 284 having a first input connected to said parallel to serial converter circuit, a second input connected to the output of said first OR gate 278 and an output; and a second OR gate 286 having a first input connected to the output of said fifth AND gate 280, a second input connected to the output of said sixth AND gate 282, a third input connected to the output of said of seventh AND gate 284 and an output connected to said first summing circuit.

8. The circuit of claim 1 wherein said parallel to serial conversion circuit comprises:

a first NAND gate 444 having a first input for receiving a third data/dither bit of said first digital equivalent signal from said first storage means, a second input for receiving said read three bit signal and an output;

a second NAND gate 446 having a first input for receiving a second data/dither bit of said first digital equivalent data signal from said first storage means, a second input for receiving said read three bit signal and an output;

a third NAND gate 448 having a first input connected to the output of said first NAND gate 444, a second input for receiving said read three bit signal and an output;

a fourth NAND gate 450 having a first input connected to the output of said second NAND gate 446, a second input for receiving said read three bit signal and an output;

a first Flip-Flop 452 having a preset input connected to the output of said first NAND gate 444, a reset input connected to the output of said third NAND gate 448, a clock input and a Q output;

a second Flip-Flop 454 having a preset input connected to the output of said second NAND gate 446, a reset input connected to the output of said fourth NAND gate 450, a data input connected to the Q output of said first Flip-Flop 452, a clock input and a Q output;

a first inverter 458 having an input for receiving said read three bit signal and an output;

a first AND gate 460 having a first input connected to the output of said first inverter 458, a second input connected to the Q output of said second Flip-Flop 454 and an output;

a second AND gate 456 having a first input for receiving said system clock signal, a second input connected to the output of said first inverter 458 and an output connected to the clock input of said first Flip-Flop 452 and the clock input of said second Flip-Flop 454;

a first OR gate 462 having a first input connected to the output of said first AND gate 460, a second input for receiving a first data/dither bit of said first digital equivalent data signal from said first storage means and an output;

a third Flip-Flop 468 having a data input connected to the output of said first OR gate 462, a clock input for receiving said system clock signal and a Q output;

a third AND gate 474 having a first input connected to the Q output of said third Flip-Flop 468, a second input and an output;

a second inverter 476 having an input for receiving said read one bit signal and an output connected to the second input of said third AND gate 474;

a fifth NAND gate 464 having a first input for receiving said second digital equivalent signal from said second storage means, a second input for receiving said read one bit signal and an output;

a sixth NAND gate 466 having a first input connected to the output of said fifth NAND gate 464, a second input for receiving said read one bit signal and an output;

a fourth Flip-Flop 470 having a preset input connected to the output of said fifth NAND gate 464, a reset input connected to the output of said sixth NAND gate 466 and a Q output;

a fifth Flip-Flop 472 having a data input connected to the Q output of said fourth Flip-Flop 470, a clock input for receiving said system clock signal and a Q output;

a fourth AND gate 478 having a first input for receiving said read one bit signal, a second input connected to the Q output of said fifth Flip-Flop 472 and an output; and a second OR gate 480 having a first input connected to the output of said third AND gate 474, a second input connected to the output of said fourth AND gate 478 and an output for providing said first and second serial digital output signals.

9. An electronic circuit for use with a telemetry system, said telemetry system providing a fuze active logic signal, a system clock signal and a doppler select signal, said electronic circuit comprising:

an input terminal for receiving an analog signal to be digitized;

programmed read only memory means for generating a digital dither signal of six bit dither words and sign bits indicative of when said six bit dither words are positive and when said six bit dither words are negative;

an analog to digital converter connected to said input terminal for converting said analog signal from analog to digital form to provide a digital data signal of six bit data words;

an adder circuit connected to said analog to digital converter and said read only memory means for adding said digital dither signal and said digital data signal to produce a first digital equivalent signal of three bit data/dither words and a second digital equivalent signal, said second digital equivalent signal being a most significant bit of each three bit data/dither word of said first digital equivalent signal;

first inverting means for inverting said system clock signal to provide an inverted system clock signal;

first state machine circuit means responsive to said inverted system clock signal, said doppler select signal and said fuze active logic signal generating a read three bit signal when said fuze active logic signal is at a first logic state and a read one bit signal when said fuze active logic signal is at a second logic state;

second state machine circuit means responsive to said system clock signal generating a doppler convert signal;

second inverting means connected to said second state machine circuit means for inverting said doppler convert signal to provide an inverted doppler convert signal;

a synchronous binary counter connected to said second inverting means and said programmed read only memory means, said synchronous binary counter receiving said inverted doppler convert signal, said synchronous binary counter responsive to said inverted doppler convert signal providing a plurality of addresses to said programmed read only memory means to effect the generation of said digital dither signal by said programmed read only memory means;

first storage means connected to said first state machine circuit means, said second state machine circuit means and said adder circuit, said first storage means receiving said first digital equivalent signal from said adder circuit;

gating means connected to said first state machine circuit means and said inverting means, for receiving said read one bit signal and said inverted system clock signal, said read one bit signal enabling said gating means allowing said inverted system clock signal to pass through said gating means;

second storage means connected to said gating means, said second state machine circuit means and said adder circuit, said second storage means receiving said second digital equivalent signal from said adder circuit;

said first and second state machine means receiving said doppler convert signal from said second state machine circuit means, said doppler convert signal effecting a continuous storage of said first digital equivalent signal in said first storage means and said second digital equivalent signal in said second storage means; and a parallel to serial converter circuit connected to said first storage means, said second storage means and said first state machine circuit means;

said first storage means responsive to said read three bit signal retrieving said first digital equivalent signal stored in said first storage means and then transferring said first digital equivalent signal to said parallel to serial converter circuit;

said parallel to serial converter circuit responsive to said read three bit signal and said system clock signal converting said first digital equivalent signal from parallel form to serial form to provide a first serial digital output signal;

said second storage means responsive to said inverted system clock signal provided by said gating means when said gating means is enabled retrieving said second digital equivalent signal stored in said second storage means and then transferring said second digital equivalent signal to said parallel to serial converter circuit;

said parallel to serial converter circuit responsive to said read one bit signal and said system clock signal passing said second digital equivalent signal through said parallel to serial converter circuit to provide a second serial digital output signal.

10. The electronic circuit of claim 9 further comprising:

a first read address generating counter connected to said first state machine circuit means and said first storage means, said first read address generating counter responsive to said read three bit signal providing a plurality of read three bit addresses to said first storage means;

a second read address generating counter connected to said gating means and said second storage means, said second read address generating counter responsive to said inverted system clock signal provided by said gating means when said gating means is enabled providing a plurality of read one bit addresses to said second storage means;

a first write address generating counter connected to said second state machine circuit means and said first storage means, said first write address generating means responsive to said doppler convert signal providing a plurality of write three bit addresses to said first storage means; and a second write address generating counter connected to said second state machine circuit means and said second storage means, said second write address generating means responsive to said doppler convert signal providing a plurality of write one bit addresses to said second storage means.

11. The electronic circuit of claim 9 wherein said gating means comprises an AND gate having a first input connected to said first state machine circuit means, a second input connected to said inverting means and an output connected to said second storage means.

12. The electronic circuit of claim 9 wherein said adder circuit comprises:

a carry bit generating circuit having six data inputs for receiving three least significant dither bits of the six bit dither words of said digital dither signal and three least significant data bits of the six bit data words of said digital data signal, said carry bit generating circuit adding the three least significant bits of said digital dither signal to the three least significant bits of said digital data signal to provide a first carry bit;

a first summing circuit having three inputs for receiving a fourth dither bit of the six bit dither words of said digital dither signal, a fourth data bit of the six bit data words of said digital data signal and said first carry bit, said first summing circuit adding said fourth dither bit and said first carry bit to said fourth data bit to provide a first data/dither bit of the three bit data/dither words of said first digital equivalent signal and a second carry bit;

a second summing circuit having three inputs for receiving a fifth dither bit of the six bit dither words of said digital dither signal, a fifth data bit of the six bit data words of said digital data signal and said second carry bit, said second summing circuit adding said fifth dither bit and said second carry bit to said fifth data bit to provide a second data/dither bit of the three bit data/dither words of said first digital equivalent signal and a third carry bit;

a third summing circuit having three inputs for receiving a sixth dither bit of the six bit dither words of said digital dither signal, a sixth data bit of the six bit data words of said digital data signal and said third carry bit, said third summing circuit adding said sixth dither bit and said third carry bit to said sixth data bit to provide a third data/dither bit of the three bit data/dither words of said first digital equivalent signal and a fourth carry bit; and a clipping circuit having five inputs for receiving said first, second and third data/dither bits of the three bit data/dither words of said first digital equivalent signal, said fourth carry bit, and said sign bits;

said clipping circuit responsive to said fourth carry bit and said sign bits passing the three bit data/dither words of said first digital equivalent signal therethrough or clipping said first, second and third data/dither bits of the three bit data/dither words of said first digital equivalent signal to a predetermined logic state.

13. The electronic circuit of claim 12 wherein said first, second and third summing circuits each comprise:

a first EXCLUSIVE-OR circuit 290 having a first input connected to said programmed read only memory means, a second input connected to said analog to digital converter and an output;

a second EXCLUSIVE-OR circuit 298 having a first input connected to said first EXCLUSIVE-OR circuit 290, a second input for receiving one of said first, second and third carry bits and an output connected to one of the five inputs of said clipping circuit;

a first AND gate 292 having a first input connected to said programmed read only memory means, a second input connected to said analog to digital converter and an output;

a second AND gate 294 having a first input connected to said analog to digital converter, a second input for receiving one of said first, second and third carry bits and an output;

a third AND gate 296 having a first input connected to said programmed read only memory means, a second input for receiving one of said first, second and third carry bits and an output; and an OR gate 300 having a first input connected to the output of said first AND gate 292, a second input connected to the output of said second AND gate 294, a third input connected to the output of said third AND gate 296 and an output connected to another of the five inputs of said clipping circuit.

14. The electronic circuit of claim 12 wherein said clipping circuit comprises:

a first NAND gate 302 having a first input connected to said first summing circuit for receiving said first data/dither bit, a second input and an output;

a second NAND gate 304 having a first input connected to said second summing circuit for receiving said second data/dither bit, a second input and an output;

a third NAND gate 306 having a first input connected to said third summing circuit for receiving said third data/dither bit, a second input and an output;

a first inverter 314 having an input connected to said third summing circuit for receiving said fourth carry bit and an output;

a second inverter 316 having an input connected to said programmed read only memory means for receiving said sign bits and an output;

a fourth NAND gate 318 having a first input connected to the output of said first inverter, a second input connected to said programmed read only memory means for receiving said sign bits and an output connected to the second input of said first NAND gate 302, the second input of said second NAND gate 304 and the second input of said third NAND gate 306;

a fifth NAND gate 320 having a first input connected to said third summing circuit for receiving said fourth carry bit, a second input connected to the output of said second inverter 316 and an output;

a sixth NAND gate 308 having a first input connected to the output of said first NAND gate 302, a second input connected to the output of said fifth NAND gate 320 and an output;

a seventh NAND gate 310 having a first input connected to the output of said second NAND gate 304, a second input connected to the output of said fifth NAND gate 320 and an output; and an eighth NAND gate 312 having a first input connected to the output of said third NAND gate 306, a second input connected to the output of said fifth NAND gate 320 and an output;

the output of sixth NAND gate 308, the output of said seventh NAND gate 310 and the output of said eighth NAND gate 312 providing said first digital equivalent signal of three bit data/dither words;

15. The electronic circuit of claim 12 wherein said carry bit generating circuit comprises:

a first AND gate 272 having a first input connected to said programmed read only memory means, a second input connected to said parallel to serial converter circuit and an output;

a second AND gate 274 having a first input connected to the output of said first AND gate 272, a second input connected to said programmed read only memory means and an output;

a third AND gate 276 having a first input connected to said programmed read only memory means, a second input connected to said parallel to serial converter circuit and an output;

a fourth AND gate 277 having a first input connected to said parallel to serial converter circuit, a second input connected to the output of said first AND gate 272 and an output;

a first OR gate 278 having a first input connected to the output of said second AND gate 274, a second input connected to the output of said third AND gate 276, a third input connected to the output of fourth AND gate 277 and an output;

a fifth AND gate 280 having a first input connected to the output of first OR gate 280, a second input connected to said programmed read only memory means and an output;

a sixth AND gate 282 having a first input connected to said programmed read only memory means, a second input connected to said parallel to serial converter circuit and an output;

a seventh AND gate 284 having a first input connected to said parallel to serial converter circuit, a second input connected to the output of said first OR gate 278 and an output; and a second OR gate 286 having a first input connected to the output of said fifth AND gate 280, a second input connected to the output of said sixth AND gate 282, a third input connected to the output of said of seventh AND gate 284 and an output connected to said first summing circuit.

16. The circuit of claim 9 wherein said parallel to serial conversion circuit comprises:

a first NAND gate 444 having a first input for receiving a third data/dither bit of said first digital equivalent signal from said first storage means, a second input for receiving said read three bit signal and an output;

a second NAND gate 446 having a first input for receiving a second data/dither bit of said first digital equivalent data signal from said first storage means, a second input for receiving said read three bit signal and an output;

a third NAND gate 448 having a first input connected to the output of said first NAND gate 444, a second input for receiving said read three bit signal and an output;

a fourth NAND gate 450 having a first input connected to the output of said second NAND gate 446, a second input for receiving said read three bit signal and an output;

a first Flip-Flop 452 having a preset input connected to the output of said first NAND gate 444, a reset input connected to the output of said third NAND gate 448, a clock input and a Q output;

a second Flip-Flop 454 having a preset input connected to the output of said second NAND gate 446, a reset input connected to the output of said fourth NAND gate 450, a data input connected to the Q output of said first Flip-Flop 452, a clock input and a Q output;

a first inverter 458 having an input for receiving said read three bit signal and an output;

a first AND gate 460 having a first input connected to the output of said first inverter 458, a second input connected to the Q output of said second Flip-Flop 454 and an output;

a second AND gate 456 having a first input for receiving said system clock signal, a second input connected to the output of said first inverter 458 and an output connected to the clock input of said first Flip-Flop 452 and the clock input of said second Flip-Flop 454;

a first OR gate 462 having a first input connected to the output of said first AND gate 460, a second input for receiving a first data/dither bit of said first digital equivalent data signal from said first storage means and an output;

a third Flip-Flop 468 having a data input connected to the output of said first OR gate 462, a clock input for receiving said system clock signal and a Q output;

a third AND gate 474 having a first input connected to the Q output of said third Flip-Flop 468, a second input and an output;

a second inverter 476 having an input for receiving said read one bit signal and an output connected to the second input of said third AND gate 474;

a fifth NAND gate 464 having a first input for receiving said second digital equivalent signal from said second storage means, a second input for receiving said read one bit signal and an output;

a sixth NAND gate 466 having a first input connected to the output of said fifth NAND gate 464, a second input for receiving said read one bit signal and an output;

a fourth Flip-Flop 470 having a preset input connected to the output of said fifth NAND gate 464, a reset input connected to the output of said sixth NAND gate 466 and a Q output;

a fifth Flip-Flop 472 having a data input connected to the Q output of said fourth Flip-Flop 470, a clock input for receiving said system clock signal and a Q output;

a fourth AND gate 478 having a first input for receiving said read one bit signal, a second input connected to the Q output of said fifth Flip-Flop 472 and an output; and a second OR gate 480 having a first input connected to the output of said third AND gate 474, a second input connected to the output of said fourth AND gate 478 and an output for providing said first and second serial digital output signals.

* * * * *